United States Patent
Iida

[19]

[11] Patent Number: 6,163,061
[45] Date of Patent: Dec. 19, 2000

[54] INFRARED SOLID-STATE IMAGE SENSOR AND MANUFACTURING METHOD THEREOF

[75] Inventor: Yoshinori Iida, Tokyo, Japan

[73] Assignee: Kabushiki Kaisha Toshiba, Kawasaki, Japan

[21] Appl. No.: 09/129,691

[22] Filed: Aug. 5, 1998

(Under 37 CFR 1.47)

[30] Foreign Application Priority Data

Aug. 6, 1997 [JP] Japan ..................................... 9-211978

[51] Int. Cl.$^7$ .................... H01L 31/058; H01L 27/14; H01L 29/82; H01L 29/84
[52] U.S. Cl. ........................... 257/467; 257/414; 257/415
[58] Field of Search .................... 257/415, 417, 257/418, 419, 420, 619, 467, 469, 414

[56] References Cited

U.S. PATENT DOCUMENTS

| | | | |
|---|---|---|---|
| 5,288,649 | 2/1994 | Keenan | 437/3 |
| 5,523,564 | 6/1996 | Yamada et al. | 250/338.1 |
| 5,534,111 | 7/1996 | Hocker et al. | 216/15 |
| 5,560,711 | 10/1996 | Bu | 374/109 |
| 5,583,058 | 12/1996 | Utsumi et al. | 437/3 |
| 5,594,248 | 1/1997 | Tanaka | 250/332 |
| 5,850,098 | 12/1998 | Butler et al. | 257/467 |

OTHER PUBLICATIONS

Toshio Kanno, et al., "Uncooled Infrared Focal Plane Array Having 128×128 Thermopile Detector Elements", SPIE vol. 2269, Infrared Technology XX (1994), pp. 450–459.

*Primary Examiner*—Mahshid Saadat
*Assistant Examiner*—Allan R. Wilson
*Attorney, Agent, or Firm*—Oblon, Spivak, McClelland, Maier & Neustadt, P.C.

[57] ABSTRACT

An infrared solid-state image sensor comprises a semiconductor substrate, a first diaphragm, supported on the semiconductor substrate via a first support portion, for supporting a hot junction of thermocouples for converting a temperature change, caused by irradiation of infrared rays to an infrared absorption layer, to an electric signal, and the infrared absorption layer, and a second diaphragm, supported on the semiconductor substrate via a second support portion, for supporting a wiring portion for outputting a signal from the hot junction of the thermocouples.

34 Claims, 13 Drawing Sheets

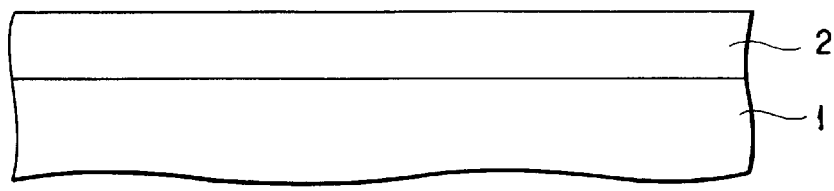
F I G. 9A
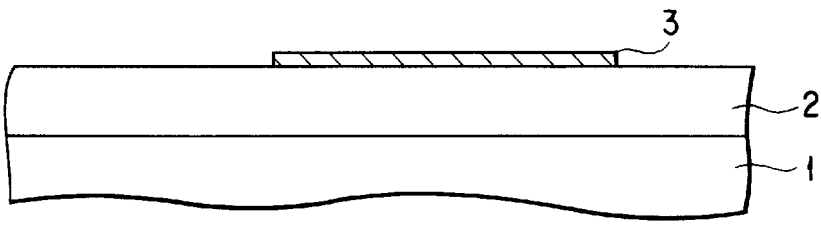
F I G. 9B
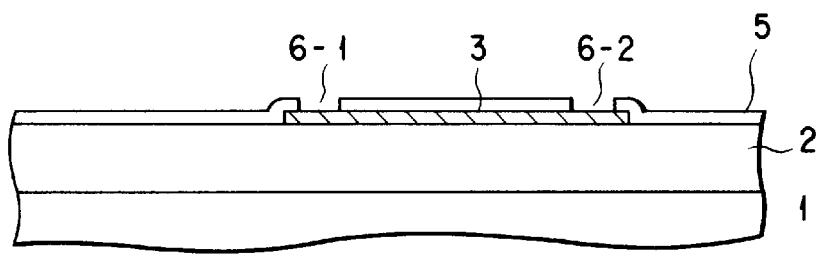
F I G. 9C
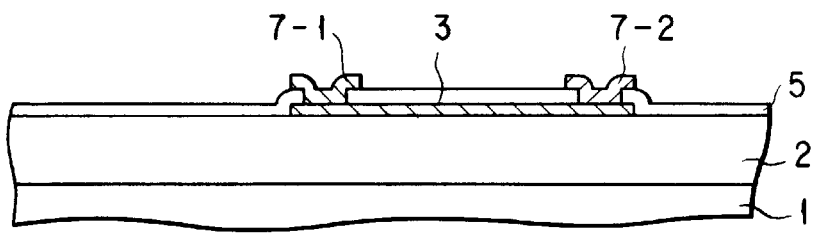
F I G. 9D
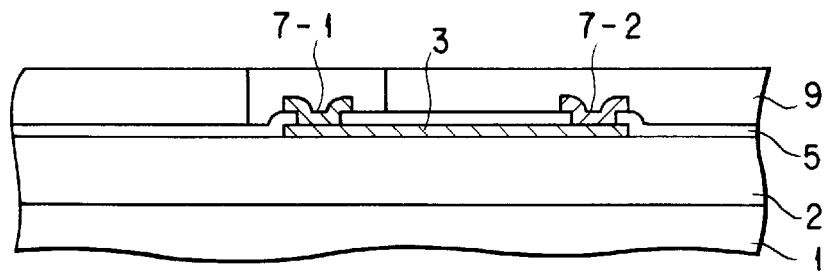
F I G. 9E

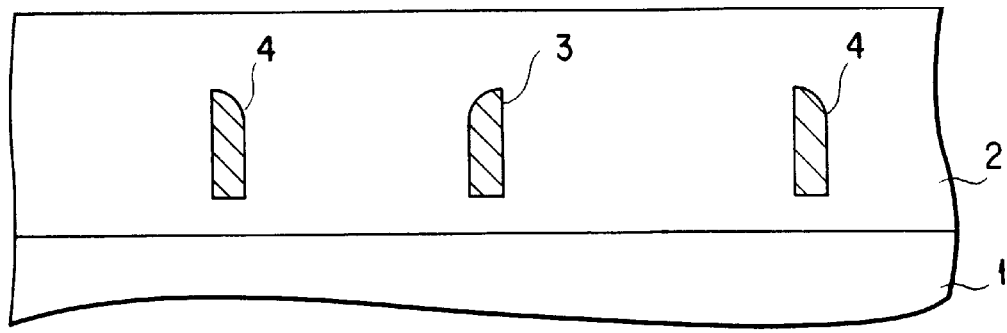
F I G. 13A
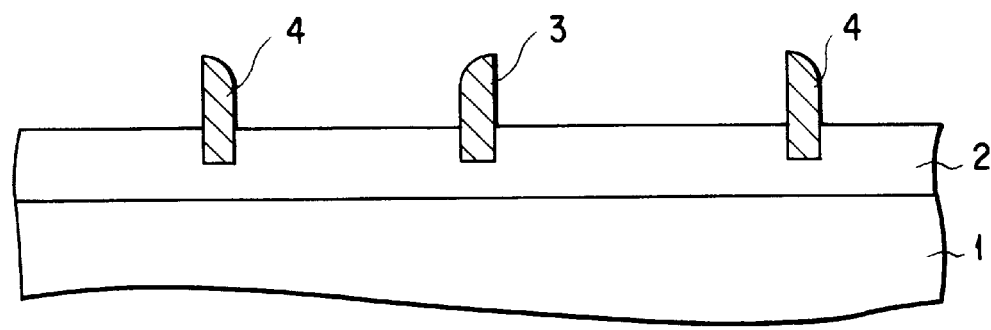
F I G. 13B
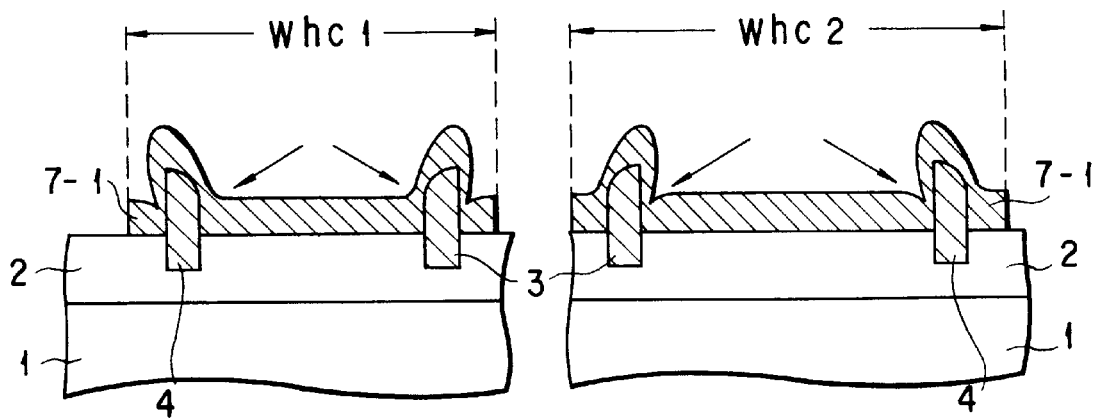
F I G. 13C  F I G. 13D

INFRARED SOLID-STATE IMAGE SENSOR AND MANUFACTURING METHOD THEREOF

BACKGROUND OF THE INVENTION

The present invention relates to an infrared solid-state image sensor, and, more particularly, to an uncooled infrared solid-state image sensor and a manufacturing method thereof.

Infrared image sensing is characterized in its ability to pick up images at night as well as during the daytime and its higher transmittance to smoke and fog than visible radiation. Being capable of acquiring temperature information of an object to be sensed, infrared image sensors are adaptable to a variety of applications, such as a monitor camera and a fire detection camera, besides the field of defense.

Recently extensive studies have been made on "uncooled infrared solid-state imaging elements" which eliminate the need for the cooling mechanism to permit a low-temperature operation, which is the biggest shortcoming of a photoelectric conversion type infrared solid-state image sensor or a leading conventional type. The following infrared solid-state image sensors have been proposed.

(1) An infrared solid-state image sensor which uses, as a thermoelectric conversion element, a thermopile for converting a temperature difference to a potential difference through the Seebeck effect (Toshio Kanno, et al., Proc. SPIE vol. 2269, pp. 450–459, 1994).

(2) An infrared solid-state image sensor which uses, as a thermoelectric conversion element, a bolometer for converting a temperature change to a change in resistance based on the temperature change of a resistor (R. A. Wood, Proc. IEDM, pp. 175–177, 1993).

(3) An infrared solid-state image sensor which uses, as a thermoelectric conversion element, a pyroelectric element for converting a temperature change to charges based on the pyroelectric effect (Charles Hanson, et al., proc. SPIE Vol. 2020, pp. 330–339, 1993).

Of those three thermoelectric conversion systems, a thermopile element which uses a polysilicon film as a thermoelectric conversion material appears advantageous from the viewpoint of fabrication due to its feature that the entire manufacturing process for the element can be implemented by the existing silicon process.

For a thermopile type, the sensitivity R of an infrared solid-state image sensor is expressed by the following equation (see, for example, Paul w. Kruse, Proc. SPIE, Vol. 2552, pp. 556–563).

$$R = N \cdot S \cdot \eta / \{G(1+\omega^2\tau^2)^{1/2}\} = N \cdot S \cdot \eta / (G^2+\omega^2 C^2)^{1/2} \quad (1)$$

where

N: the number of series connections of the thermopile,
S: Seebeck coefficient of the thermopile,
$\eta$: infrared absorptance,
G: thermal conductance,
$\omega$: modulation angular frequency of incident infrared rays,
$\tau$: thermal response time ($\tau=C/G$), and
C: heat capacity of the thermoelectric conversion section.

The sensitivity R for a bolometer type is given by:

$$R = Ib \cdot \alpha \cdot Re \cdot \eta / \{G(1+\omega^2\tau^2)^{1/2}\} \quad (2)$$

where

Ib: bias current,
$\alpha$: temperature coefficient of a resistor ($=(1/Re)(dRe/dT)$), and
Re: element resistance.

The sensitivity may be improved by increasing the bias current Ib. In this case, however, it is necessary to consider the influence of self heating originating from the energy consumption of $Ib^2 \cdot Re$.

The thermal terms in the equations 1 and 2, which both include the thermal conductance G and the heat capacity C, are expressed by the following equation.

$$Rt = 1/\{G(1+\omega^2\tau^2)^{1/2}\} = 1/(G^2+\omega^2 C^2)^{1/2} \quad (3)$$

It is apparent from this equation that reducing the thermal conductance G and the heat capacity C is important to improve Rt. In a low-frequency region, particularly, the sensitivity is improved by reducing the thermal conductance G. The heat capacity C, on the other hand, greatly contributes to the sensitivity in a high-frequency region or so-called response.

The thermal conductance G and heat capacity C in the equations 1 to 3 include not only values which are inevitable to transfer the output signal from the thermopile or bolometer to the semiconductor substrate, but also the values of the thermal conductance G and heat capacity C which are originated from the material layer that is present between the thermoelectric conversion material and the semiconductor substrate.

Because of those reasons, to thermally isolate the thermoelectric conversion element from the semiconductor substrate for temperature information readout and suppress an increase in thermal conductance G, uncooled infrared solid-state image sensors employ a cavity structure constructed by forming a cavity in the semiconductor substrate (see FIG. 1), or a cavity structure provided by forming a sacrificial layer in a multilayer structure on the semiconductor substrate and then etching that layer out (see FIG. 2), or connecting thermoelectric conversion elements, thermally isolated from one another, to the semiconductor substrate by bumps. Those thermal isolation structures achieve a high sensitivity.

A typical scheme of enhancing the output voltage of a thermopile is to connect N pairs of thermocouples in series as shown in FIG. 3 (N=12 in this example).

In principle, however, the thermopile infrared solid-state image sensor, which is considered advantageous from the manufacturing viewpoint due to the aforementioned feature of permitting the use of the silicon process, suffers a disadvantage on the thermal isolation structure for the following reason.

The bolometer type which detects a temperature change from a change in the resistance of a resistor should only have a pair of wires formed between the heat sensing side and the heat sink side as means for detecting a resistance change. The bolometer type therefore needs merely two heat transfer paths between the heat sensing portion and the heat sink. The thermopile element, by contrast, operates based on the Seebeck effect which converts a temperature difference between a hot junction and a cold junction of a thermocouple to a potential difference. To increase the potential difference thus requires series connection of thermocouples. As a result, the thermocouples themselves require heat transfer paths, which are twice number of the thermocouples to be connected in series, between the hot junction and cold junction.

In the case of the thermopile type, in particular, it is significantly important to suppress increases in the thermal conductance G and heat capacity C, which are caused by the material of the thermocouples as the thermocouples are series-connected.

The thermal conductance Gpoly produced by polysilicon or the material for the thermocouples is given by:

$$Gpoly = 2N \cdot G0(Si) \cdot Spoly/Lpoly \quad (4)$$

where

G0(Si): thermal conductivity of polysilicon (=29 W/K/m),

Spoly: cross-sectional area of polysilicon [$m^2$], and

Lpoly: length of polysilicon between a hot junction edge and a cold junction edge [m].

As apparent from the above, a design technique of realizing a longer Lpoly for the same pixel size is considerably important.

The aforementioned scheme of connecting a plurality of thermocouples in series however suffers not only an increase in the number of heat transfer paths but also its inability to provide sufficiently long Lpoly. Therefore, the thermal conductance of a single heat transfer path cannot be sufficiently reduced.

In the thermoelectric conversion structure in above pixel, the hot junction of a thermocouple and the structure of thermally isolating an infrared ray absorbent, connected to the thermocouple, from the wiring portion of the thermocouple are not often considered conventionally. If the infrared ray absorbent and the wiring portion of the thermocouple both exist on the same diaphragm, for example, the thermal conductance between the hot junction of the thermocouple and the semiconductor substrate increases. To ensure a higher sensitivity, therefore, some kind of measure should be taken.

The use of a silicon oxide film or silicon nitride film for a support layer needed to construct the aforementioned cavity structure has already been reported (Toshio Kanno, et al., Proc. SPIE vol. 2269, pp. 450–459, 1994, and R. A. Wood, Proc. IEDM, pp. 175–177, 1993). As micronization of the thermoelectric conversion material progresses in accordance with reduction in pixel size, the influence of increases in the thermal conductance G and the heat capacity C, caused by the presence of the support layer, on the sensitivity cannot be neglected.

Even with the same cavity structure being formed, therefore, the thermopile element which has multiple heat transfer paths formed by the thermoelectric conversion elements themselves has a higher thermal conductance G between the thermoelectric conversion element and the semiconductor substrate, as compared with the bolometer element. This results in a lower sensitivity.

A noise equivalent temperature difference (NETD), one important characteristic besides the sensitivity, is proportional to the reciprocal of the product, Ad·R, of the detected area Ad and the sensitivity R. To reduce the pixel size of an infrared solid-state image sensor, therefore, it is understood that merely keeping the sensitivity R is not enough but further improvement of the sensitivity R is needed to compensate for a drop of NETD which may result from the reduction of the detection area Ad.

According to the conventional processing technique, Spoly is reduced by making the polysilicon film thinner. As the polysilicon width is limited by the photolithography technology, however, Spoly cannot be made sufficiently small.

For a fine pixel structure, to reduce the heat capacity C of the hot junction of thermocouples and reduce the thermal conductance G, it is effective for the thermocouples above the cavity structure to support by themselves.

The self-supporting of the thermocouples above the cavity structure requires that the thermocouples should have a mechanical strength as a support member.

In consideration of the polysilicon-based thermocouple structure used in the equation 4, a change Z in the gravitational direction at a hot junction when a load is applied to the hot-junction side of polysilicon secured to a cold junction edge is given by the following equation. For the sake of simplicity, the cross-sectional structure is rectangular.

$$Z = (4Lpoly^3/Wpoly \cdot Hpoly^3) \times \{M \cdot g/E(Si)\} \quad (5)$$

where

Wpoly: width of polysilicon [m],

Hpoly: height of polysilicon [m],

M: mass of the hot junction [kg], and g: gravity [$m/sec^2$]

E(Si): Young's modulus of silicon (=113.0 [$GN/m^2$]).

As apparent from the equation 5, for the same cross-sectional area, it is very important to make Wpoly smaller and Hpoly larger in order to prevent deformation of the thermocouples.

This tendency should become particularly important in further miniaturization of pixels that people are unquestionably trying very hard to achieve. According to the conventional technique, however, rather the opposite tendency takes place for Spoly, so that a support layer of oxidation silicon or silicon nitride should be formed at the price of the increased thermal conductance G and heat capacity C.

Because, as apparent from the above, a thermal conductance between the hot junction of a thermocouple and the semiconductor substrate of the conventional uncooled infrared solid-state image sensor cannot be made sufficiently small, an improvement on the sensitivity is limited. While there is an attempt to connect thermocouples in series to improve the sensitivity, the series connection of the thermocouples inevitably leads to increases in the thermal conductance and heat capacity caused by the thermocouples themselves. This attempt thus has difficulty in achieving a sufficient sensitivity.

BRIEF SUMMARY OF THE INVENTION

It is an object of the present invention to provide an infrared solid-state image sensor and a manufacturing method thereof, which can reduce the thermal conductance between the hot junction of a thermocouple and the semiconductor substrate to a sufficiently low level, thereby improving the infrared ray sensitivity.

To achieve this object, the present invention employs the following structures.

A first infrared solid-state image sensor according to the present invention comprises a semiconductor substrate; a first diaphragm, supported on the semiconductor substrate via a first support portion, for supporting a hot junction of thermocouples for converting a temperature change, caused by irradiation of infrared rays to an infrared absorption layer, to an electric signal, and the infrared absorption layer; and a second diaphragm, supported on the semiconductor substrate via a second support portion, for supporting a wiring portion for outputting a signal from the hot junction of the thermocouples. In the first infrared solid-state image sensor, the first diaphragm has a rectangular shape, and one corner portion of the first diaphragm is connected via the first support portion to the semiconductor substrate; and the second diaphragm is so formed as to surround the first diaphragm, and is connected to the semiconductor substrate via second support portions at two locations close to the first support portion, and the infrared absorption layer formed on the first diaphragm is connected to the hot junction of the thermocouples at an orthogonal position to the first support portion of the first diaphragm.

According to the first infrared solid-state image sensor of the present invention, which is a thermoelectric conversion type uncooled infrared solid-state image sensor, the thermocouples made of finely processed polysilicon or the like are provided, and the first diaphragm for supporting the hot junction of the thermocouples and the infrared absorption layer, and the second diaphragm for supporting the wiring portion of the thermocouples are supported above the semiconductor substrate for thermal isolation from the semiconductor substrate, by the independently provided (first and second) support portions with respect to the semiconductor substrate. It is therefore possible to significantly suppress the diaphragms originated increase in thermal conductance between the hot junction of the thermocouples and the semiconductor substrate. In other words, the thermal conductance between the hot junction of the thermocouples and the semiconductor substrate can be made sufficiently small, thus considerably improving the infrared ray sensitivity as compared with the prior art.

A second infrared solid-state image sensor according to the present invention comprises a semiconductor substrate; a first diaphragm having a first support portion, for supporting a wiring portion for outputting a signal from the hot junction of the thermocouples; and a second diaphragm, supported on the semiconductor substrate via the first support portion, the first diaphragm and a second support portion, for supporting a hot junction of thermocouples for converting a temperature change, caused by irradiation of infrared rays to an infrared absorption layer, to an electric signal, and the infrared absorption layer, in which the first diaphragm and the second diaphragm being formed by a same material layer.

According to the second infrared solid-state image sensor of the present invention, the first diaphragm and the second diaphragm are integrally formed by the same material layer, and the second diaphragm has a support portion between itself and the semiconductor substrate while the first diaphragm has no direct support portion between itself and the semiconductor substrate but is supported by the second diaphragm at the connecting portion between the hot junction of the thermocouples and the infrared absorption layer. Therefore, the first diaphragm does not cause an increase in the thermal conductance between the hot junction of the thermocouples and the semiconductor substrate. This can lead to an improvement on the sensitivity.

A third infrared solid-state image sensor according to the present invention comprises a semiconductor substrate; a first diaphragm having a first support portion, for supporting a wiring portion for outputting a signal from the hot junction of the thermocouples; and a second diaphragm, supported on the semiconductor substrate via the first support portion, the first diaphragm and a second support portion, for supporting a hot junction of thermocouples for converting a temperature change, caused by irradiation of infrared rays to an infrared absorption layer, to an electric signal, and the infrared absorption layer, in which the first diaphragm and the second diaphragm are formed independently.

According to the third infrared solid-state image sensor of the present invention, the first diaphragm and the second diaphragm are formed independently of each other, the second diaphragm has a support portion between itself, and the semiconductor substrate while the first diaphragm has no direct support portion between itself and the semiconductor substrate but is supported by the second diaphragm at the connecting portion between the hot junction of the thermocouples and the infrared absorption layer. Therefore, the first diaphragm does not cause an increase in the thermal conductance between the hot junction of the thermocouples and the semiconductor substrate. This can ensure an improvement on the sensitivity. If the first diaphragm is provided at a higher position than the second diaphragm (on the infrared ray detection side), the effective area of the infrared absorption layer can be increased, thereby improving the sensitivity.

A fourth infrared solid-state image sensor according to the present invention comprises a semiconductor substrate; and a thermocouple for converting a temperature change, caused by irradiation of infrared rays, to an electric signal, in which the semiconductor substrate having a cavity structure in at least a part between the semiconductor substrate and the thermocouple, a hot junction of the thermocouple is supported above the cavity structure by a wiring material for the thermocouple.

A method of fabricating an infrared solid-state image sensor for converting a temperature change, caused by irradiation of infrared rays, to an electric signal and outputting the electric signal, according to the present invention comprises the steps of: forming a sacrificial layer of oxidation silicon on a semiconductor substrate; forming on the sacrificial layer a material constituting thermoelectric conversion means for converting a temperature change to an electric signal; and etching the sacrificial layer to form a cavity structure between the semiconductor substrate and the thermoelectric conversion means.

According to the fourth infrared solid-state image sensor of the present invention and the manufacturing method thereof, there is no support layer provided for forming a cavity structure for thermal insulation from the substrate, and the thermocouples are supported by themselves (by the wiring portion of the thermocouples). It is thus possible to greatly reduce the heat capacity of the thermoelectric conversion means and the thermal conductance between the thermoelectric conversion means and the semiconductor substrate. This can ensure a higher sensitivity and a higher temperature resolution.

Further, the use of a single set of thermocouples can permit the cavity structure as well as a minute pixel to be formed and can provide sufficient sensitivity and temperature resolution.

A high-sensitivity infrared solid-state image sensor can be implemented through extremely simple manufacturing steps by forming the thermocouples of a thermocouple material directly formed on a first sacrificial layer, then forming a silicon oxide film to be a second sacrificial layer, then forming a thermocouple structure by connecting the thermocouple material by means of metal or metal silicide, and then removing the first and second sacrificial layers to thereby form a cavity structure between a semiconductor substrate and thermoelectric conversion means.

Another manufacturing method for the fourth infrared solid-state image sensor of the present invention fabricates an infrared solid-state image sensor which converts a temperature change, caused by irradiation of infrared rays, to an electric signal by means of thermocouples, and outputs the electric signal. This method comprises a step of directly forming a thermocouple material on a first sacrificial layer on a semiconductor substrate, a step of forming a silicon oxide film to be a second sacrificial layer, a step of forming a thermocouple structure by connecting the thermocouple material by means of metal or metal silicide, and a step of removing the first and second sacrificial layers, thereby forming a cavity structure between the semiconductor substrate and thermoelectric conversion means.

A fifth infrared solid-state image sensor according to the present invention is characterized in that a height h of the wiring material is larger than a width w thereof in the fourth infrared solid-state image sensor.

A method of fabricating an infrared solid-state image sensor for converting a temperature change, caused by irradiation of infrared rays, to an electric signal by means of thermocouples and outputting the electric signal, according to the present invention comprises the steps of: forming an electric signal outputting portion on a semiconductor substrate; forming a sacrificial layer for forming a cavity structure between a hot junction of the thermocouples and the semiconductor substrate; forming a step structure on the sacrificial layer by anisotropic etching; forming a wiring material for the thermocouples by isotropic film forming scheme; and etching the wiring material back by anisotropic etching, in which a height h of the wiring material is larger than a width thereof.

According to the fifth infrared solid-state image sensor of the present invention (and the manufacturing method thereof), extremely finely processed polysilicon or the like is used as a material for the thermocouple, the thickness of this polysilicon is greater than its width, and the thermocouple are supported above the cavity structure by themselves (by the wiring material of the thermocouples). It is therefore possible to considerably reduce the thermal conductance of the wiring portion while maintaining a sufficient mechanical strength. That is, the thermal conductance between the hot junction and cold junction, which dominate the sensitivity of the thermocouples, and the heat capacity of the hot junction can be reduced greatly. While the miniaturization of pixels is implemented, therefore, significant improvements on the sensitivity and the temperature resolution can be achieved as compared with the prior art.

Further, fine formation of polysilicon or the like, a material for the thermocouples, is implemented by a side wall leaving technique which consists of an isotropic film forming technique and anisotropic etching technique both using a step structure formed on the sacrificial layer for forming a cavity structure for thermal insulation between the hot junction and the semiconductor substrate. Polysilicon can be processed more finely than is allowed by the photolithography technology. This formation can be easily controlled by process parameters such as the step level of the step region, the thickness of the film formed by the isotropic film forming technique and the amount of anisotropic etching. It is thus possible to very easily fabricate a high-sensitivity infrared solid-state image sensor with a minute pixel structure.

Because a single set of thermocouples is used as a thermoelectric conversion element, it is possible to form a minute pixel structure in addition to the cavity structure and a finely processed polysilicon structure while ensuring an extremely high sensitivity.

Furthermore, as the cavity structure is formed between a semiconductor substrate and thermoelectric conversion means by directly forming a material for the thermoelectric conversion means on a sacrificial layer formed by a silicon oxide film, and then etching the sacrificial layer, a high-sensitivity infrared solid-state image sensor can be implemented through a very simple manufacturing process.

Moreover, a high-sensitivity infrared solid-state image sensor can be implemented through an extremely simple manufacturing process by forming thermoelectric conversion means of a thermocouple material directly formed on a first sacrificial layer, then forming a silicon oxide film to be a second sacrificial layer after the formation of the thermocouple material, then forming a thermocouple structure by connecting the thermocouple material by means of metal or metal silicide, and then removing the first and second sacrificial layers to thereby form a cavity structure between the semiconductor substrate and the thermoelectric conversion means.

Because the thermoelectric conversion structure of an infrared solid-state image sensor can be made significantly small without sacrificing the sensitivity as apparent from the above, it is possible to reduce the size of the optical system and cope with a multi-pixel system, thus contributing to implementation of an infrared solid-state image sensor having an fine pixel structure.

The preferable manners of the present invention are as follows.

(a) In the first infrared solid-state image sensor, the infrared absorption layer is approximately rectangular, and the portion of the infrared absorption layer which is connected to the hot junction and the first support portion are located at substantially orthogonal positions of the rectangular surface that is defined by the infrared absorption layer.

(b) In the first infrared solid-state image sensor, the second diaphragm is separated to two independent parts for two kinds of materials, which constitute the thermocouples, and those segmented second diaphragms have independent support portions between themselves and the semiconductor substrate.

(c) In the third infrared solid-state image sensor, the first diaphragm is a silicon nitride film.

(d) In the first to third infrared solid-state image sensors, both the first diaphragm and second diaphragm are silicon nitride films.

(e) In the first to third infrared solid-state image sensors, the thermocouple is a single thermocouple and is formed in a unit pixel.

(f) In the first to third infrared solid-state image sensors, a metal or metal silicide for forming the hot junction of the thermocouples is formed on an entire region where the infrared absorption layer is to be formed.

(g) In the first to fifth infrared solid-state image sensors and a manufacturing method thereof, a material for the thermocouples is polysilicon.

(h) In the first to third infrared solid-state image sensors, the thermocouples are formed of polysilicon, which is not isolated at the hot junction of the thermocouples, the polysilicon has a first region where an impurity of a first conductivity type is added, a second region where an impurity of a second conductivity type opposite to the first conductivity type is added, and a third region where an impurity of the first conductivity type and an impurity of the second conductivity type are both added, and connection by metal or metal silicide is formed in a region including a part of the first region and a part of the second region.

(i) In the first to third infrared solid-state image sensors, the thermocouples are formed of polysilicon, which is not isolated at the hot junction of the thermocouples, the polysilicon has a first region where an impurity of a first conductivity type is added, a second region where an impurity of a second conductivity type opposite to the first conductivity type is added, and a third region where neither an impurity of the first conductivity type nor an impurity of the second conductivity type is added, and connection by metal or metal silicide is formed in a region including a part of the first region and a part of the second region.

(j) In the manufacturing method for the fourth and fifth infrared solid-state image sensors, the sacrificial layer for forming the cavity structure is silicon oxide.

(k) In the manufacturing method for the fifth infrared solid-state image sensor, one set of thermocouple materials, which are formed on the side walls of a single recess of the step structure, is connected by metal or metal silicide, thereby forming a hot junction of the thermocouples.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9A through 9E are cross-sectional views illustrating manufacturing steps for the infrared solid-state image sensor according to the fifth embodiment;

FIGS. 13A through 13D are cross-sectional views showing the manufacturing steps for the infrared solid-state image sensor according to the sixth embodiment.

DETAILED DESCRIPTION OF THE INVENTION

Preferred embodiments of the present invention will now be described with reference to the accompanying drawings.

First Embodiment

Figure 4A:
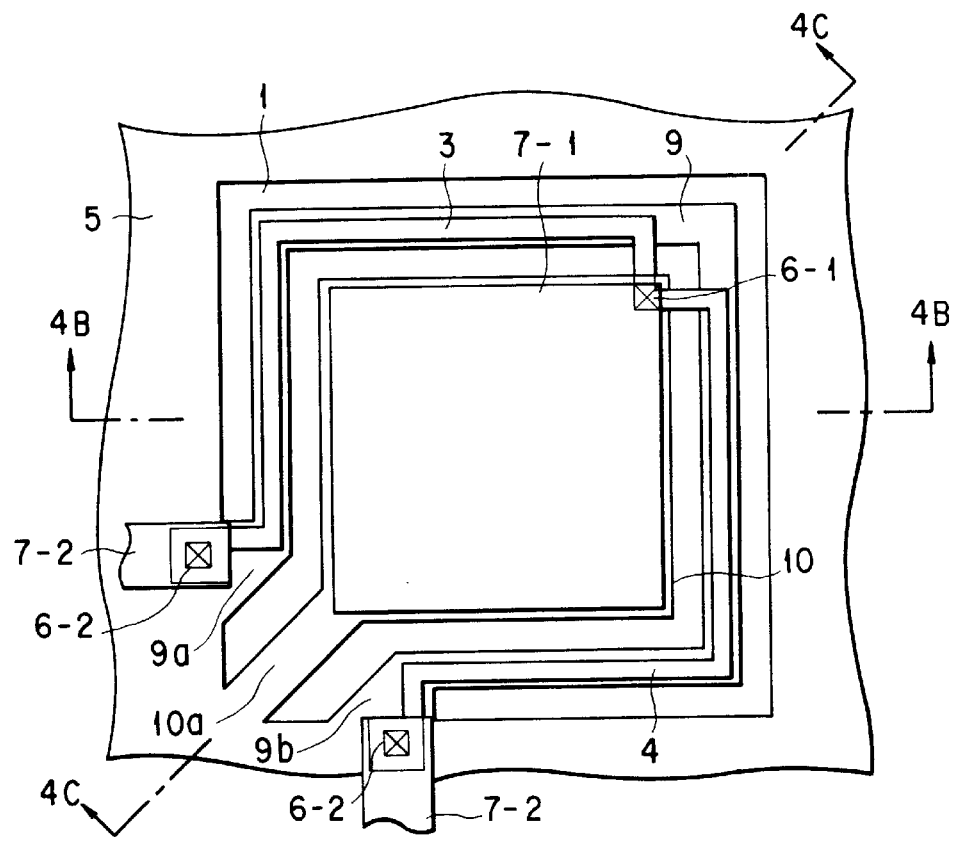
FIGS. 4A through 4C are a plan view and cross-sectional views illustrating the structure of a unit pixel portion of an infrared solid-state image sensor according to a first embodiment.
Figure 4B:
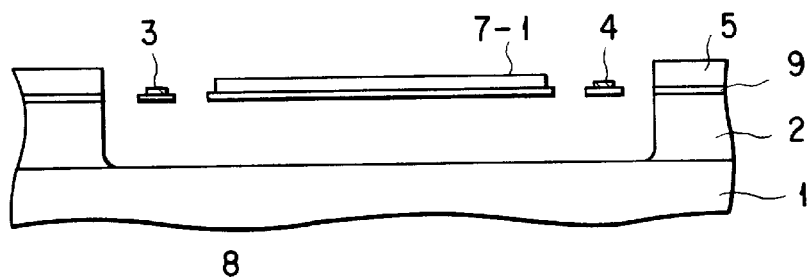
Figure 4C:
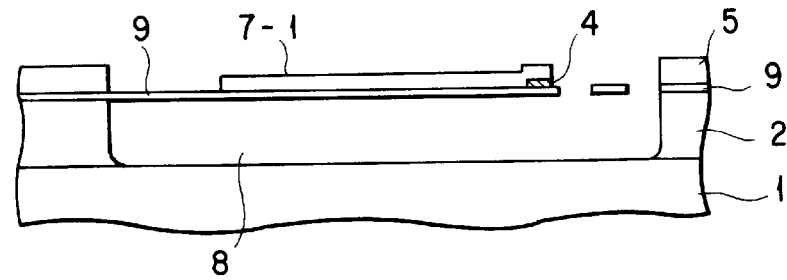

FIGS. 4A through 4C are exemplary diagrams for explaining the structure of a unit pixel portion of an infrared solid-state image sensor according to the first embodiment of the present invention. FIGS. 4A through 4C illustrate the structure of a unit pixel of a thermocouple infrared solid-state image sensor. This unit pixel structure has a cavity structure 8 formed by etching a part of a silicon oxide film 2 on a silicon substrate 1 as a sacrificial layer. P-type polysilicon 3 and n-type polysilicon 4 are connected above the cavity structure 8 by a hot junction contact metal 7-1 like aluminum.

FIG. 4A is a plan view of the unit pixel structure, and FIGS. 4B and 4C are cross-sectional views along the lines 4B—4B and 4C—4C in FIG. 4A.

Located above the cavity structure 8 is a first diaphragm 10 having a rectangular shape with one corner connected via a first support portion 10a to the substrate. A second diaphragm 9 is so arranged as to surround the first diaphragm 10. The second diaphragm 9 is connected to the substrate via second support portions 9a and 9b at two locations close to the first support portion 10a. The first and second diaphragms 10 and 9 are formed by, for example, silicon nitride films.

The hot junction contact metal 7-1 such as aluminum and an infrared absorption layer (not shown) are laminated on the first diaphragm 10. Provided on the second diaphragm 9 are a p-type polysilicon film 3 and n-type polysilicon film 4 which become the wiring portion of a thermocouple material. The polysilicon films 3 and 4 are connected to the hot junction contact metal 7-1 at an orthogonal position 6-1 of the first support portion 10a of the first diaphragm 10.

A cold junction in FIGS. 4A to 4C has such a structure that metal (e.g., cold junction metal 7-2 like aluminum) connected to the polysilicon film 3 or the thermocouple material is buried in silicon oxide films 2 and 5. Here, the cold junction metal 7-2 buried in the silicon substrate 1 is a cold junction.

In the structure in FIGS. 4A to 4C, incident infrared rays are converted to heat by the infrared absorption layer (not shown), raising the temperatures of the infrared absorption layer and the hot junction metal 7-1. As the cold junction metal 7-2 is cooled by the silicon substrate 1, the temperature does not rise. Therefore, a temperature difference proportional to the amount of the incident infrared rays is produced between the hot junction and the cold junction, and is converted to a potential difference between the hot junction and cold junction by the Seebeck effect. This potential difference is then output.

Figure 3:
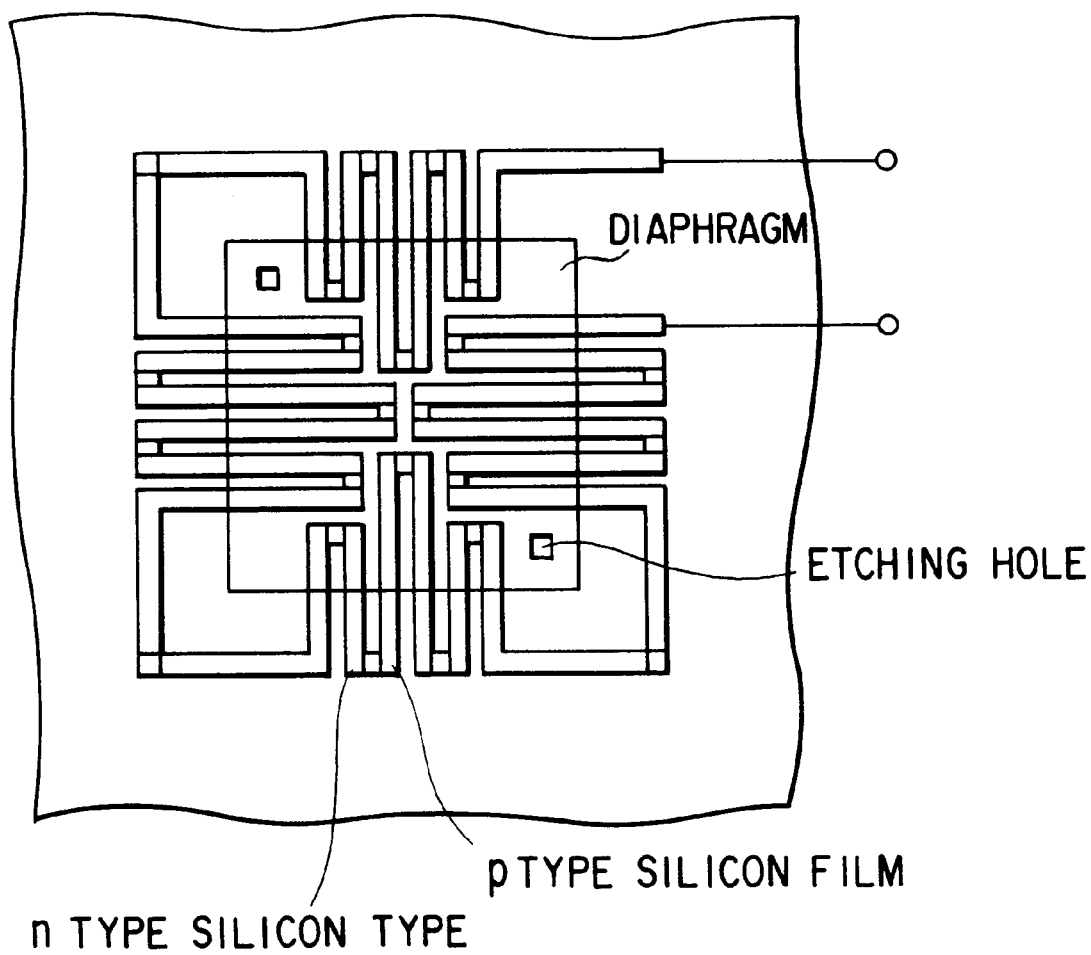
FIG. 3 is a plan view depicting the structure of a unit pixel portion of a further conventional infrared solid-state image sensor.

It is apparent from FIGS. 4A to 4C that the thermal conductance G between the hot junction and cold junction of the thermocouple is made considerably lower than that in the conventional apparatus shown in FIG. 3.

For comparison between the invention in FIGS. 4A to 4C and the conventional technique in FIG. 3, the thermal conductance G between the hot junction and cold junction will be computed approximately. As proper sizes, the area of the cavity structure portion is set $100 \ \mu m \times 100 \ \mu m = 1 \times 10^4 \ \mu m^2$, and polysilicon films doped with p- and n-type impurities as thermocouple materials are formed $0.07 \ \mu m$ thick with a process line width of $0.6 \ \mu m$.

In the conventional structure shown in FIG. 3, a total of twelve pairs of thermocouples with three kinds of distances L between the hot junction on the diaphragm and the cold junction adjacent to the diaphragm are arranged in series. The thermocouples include two pairs with the distance $L1=50 \ \mu m$, six pairs with the distance $L2=35 \ \mu m$, and four pairs with the distance $L3=15 \ \mu m$.

With a diaphragm-originated increase in the thermal conductance neglected and assuming that the thermal conductance depends only on the thermocouple materials, the thermal conductance G is roughly calculated to be $1.2 \times 10^{-6}$ W/K.

Assume that infrared light is modulated with a sufficiently low frequency. Then, the effect of the increased output voltage produced by the series arrangement of twelve pairs of thermocouples can be substituted with the effect of reducing the thermal conductance in a single thermocouple structure from the equation 1. In consideration of that effect, $G'=G/N=G/12=1.7 \times 10^{-7}$ W/K.

The structure of the present invention illustrated in FIGS. 4A to 4C has only a single pair of thermocouples, with polysilicon as the thermocouple material having a length L of $150 \ \mu m$ between the hot junction and cold junction. On the same assumption as taken for the conventional structure, the thermal conductance G in FIGS. 4A to 4C is roughly computed to be $G=3 \times 10^{-8}$ W/K. In the comparison including the series effect of the thermocouples, the structure of the present invention shown in FIGS. 4A to 4C can apparently provide about six times as high a sensitivity as one acquired by the conventional structure in FIG. 3.

According to the first embodiment, the first diaphragm 10 where the infrared absorption layer and the hot junction contact metal 7-1 are placed and the second diaphragm 9 for supporting the polysilicon films 3 and 4 which become the wiring portion of the thermocouples are provided, and the polysilicon films 3 and 4 are connected to the contact metal 7-1 on the first diaphragm 10, forming the hot junction of the thermocouples. This structure can significantly reduce the thermal conductance between the hot junction of the thermocouples and the silicon substrate 1, resulting in a considerable improvement on the infrared ray sensitivity.

Second Embodiment

Figure 5A:
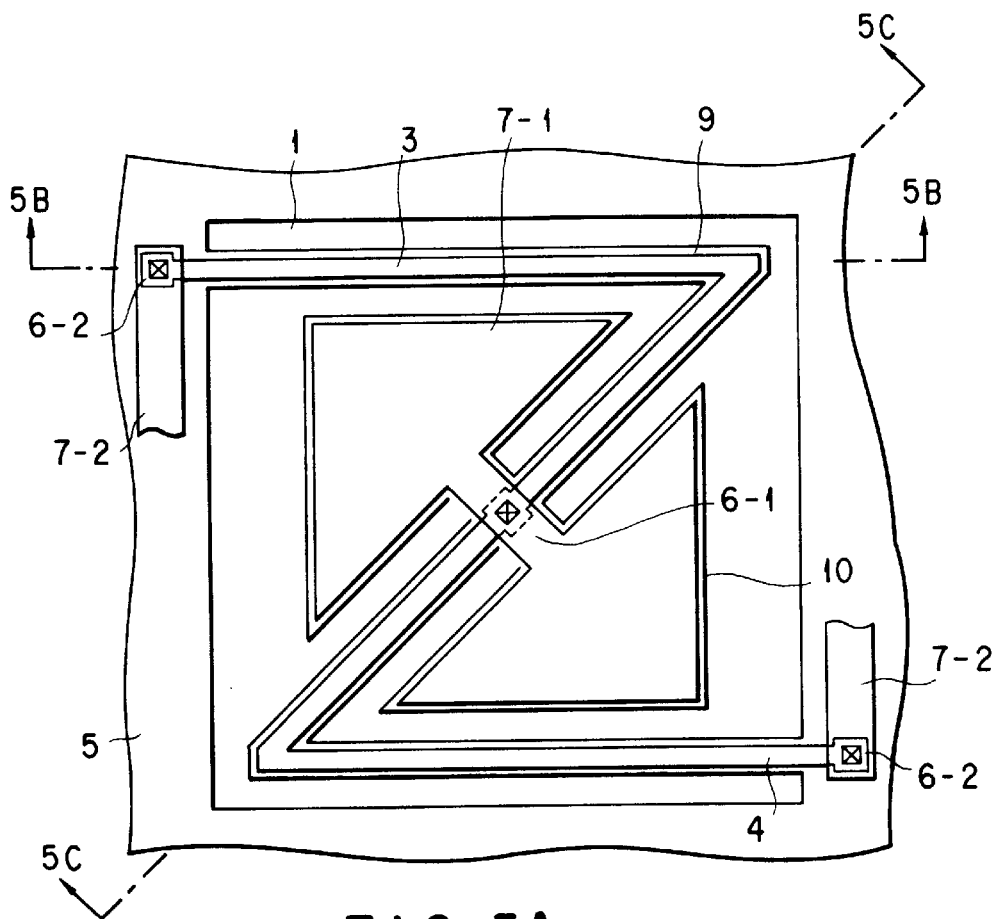
FIGS. 5A through 5C are a plan view and cross-sectional views showing the structure of a unit pixel portion of an infrared solid-state image sensor according to a second embodiment.
Figure 5B:
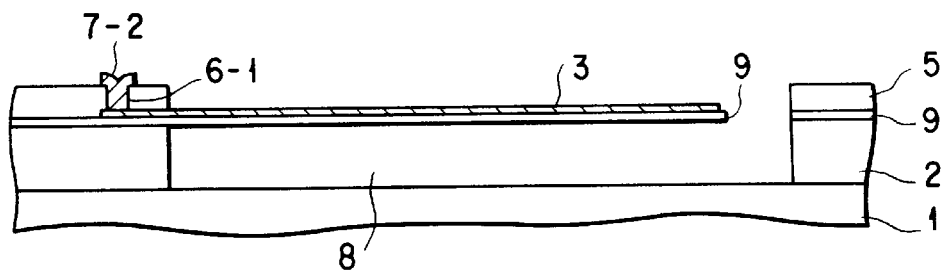
Figure 5C:
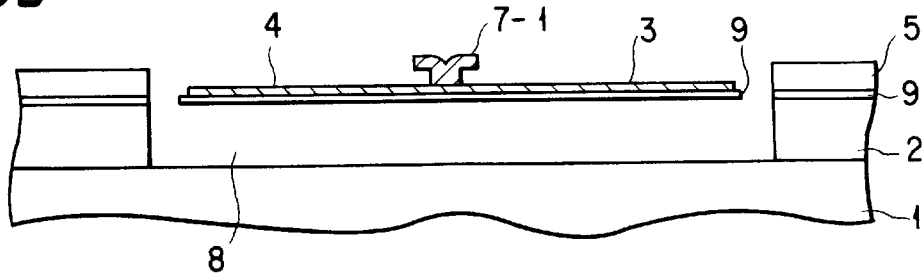

FIGS. 5A through 5C are exemplary diagrams for explaining the structure of a unit pixel portion of an infrared solid-state image sensor according to the second embodiment of the present invention. FIGS. 5A through 5C illustrate the structure of a unit pixel of a thermopile infrared solid-state image sensor. This unit pixel structure has a cavity structure 8 formed by etching a part of a silicon oxide film 2 on a silicon substrate 1 as a sacrificial layer. P-type polysilicon 3 and n-type polysilicon 4 are connected above the cavity structure 8 by a hot junction contact metal 7-1 such as aluminum.

FIG. 5A is a plan view of the unit pixel structure, and FIGS. 5B and 5C are cross-sectional views along the lines 5B—5B and 5C—5C in FIG. 5A.

A cold junction in FIGS. 5A to 5C has such a structure that metal (e.g., cold junction metal 7-2 like aluminum) connected to the polysilicon film 3 or the thermocouple material is buried in silicon oxide films 2 and 5. Here, the cold junction metal 7-2 buried in the silicon substrate 1 is a cold junction.

In the structure in FIGS. 5A to 5C, incident infrared rays are also converted to heat by the infrared absorption layer, raising the temperatures of the infrared absorption layer and the hot junction metal 7-1, as per the first embodiment. As the cold junction metal 7-2 is cooled by the silicon substrate 1, the temperature does not rise.

The structure in FIGS. 5A to 5C differs from that in FIGS. 4A to 4C in the following two points.

(1) The first diaphragm 10, which supports the hot junction contact metal 7-1 of the thermocouples and the infrared absorption layer, and the second diaphragm 9, which supports the polysilicon wiring layers 3 and 4, the material for the thermocouples, are integrally formed by the same material layer.

(2) Only the second diaphragm 9 has a support structure to the semiconductor substrate 1, and the first diaphragm 10, which supports the hot junction contact metal 7-1 of the thermocouples and the infrared absorption layer, is supported by the second diaphragm 9.

More specifically, the first diaphragm 10 is shaped in such a way that a part of the rectangular shape is cut away from the peripheral portion along the orthogonal direction, and the second diaphragm 9 is formed in the shape of Z, the first and second diaphragms 10 and 9 having the common center portion.

In the structure shown in FIGS. 5A to 5C, the first diaphragm 10, which supports the region whose temperature rises with absorption of infrared rays, is not directly supported on the silicon substrate 1. This does not cause any increase in the thermal conductance between the hot junction and the cold junction of the thermocouples which would otherwise originate from the heat conduction of the first diaphragm 10.

As a temperature rise of the heat sensing portion with respect to the same incident infrared light can be increased, therefore, a high-sensitivity infrared solid-state image sensor can be realized.

Third Embodiment

Figure 6A:
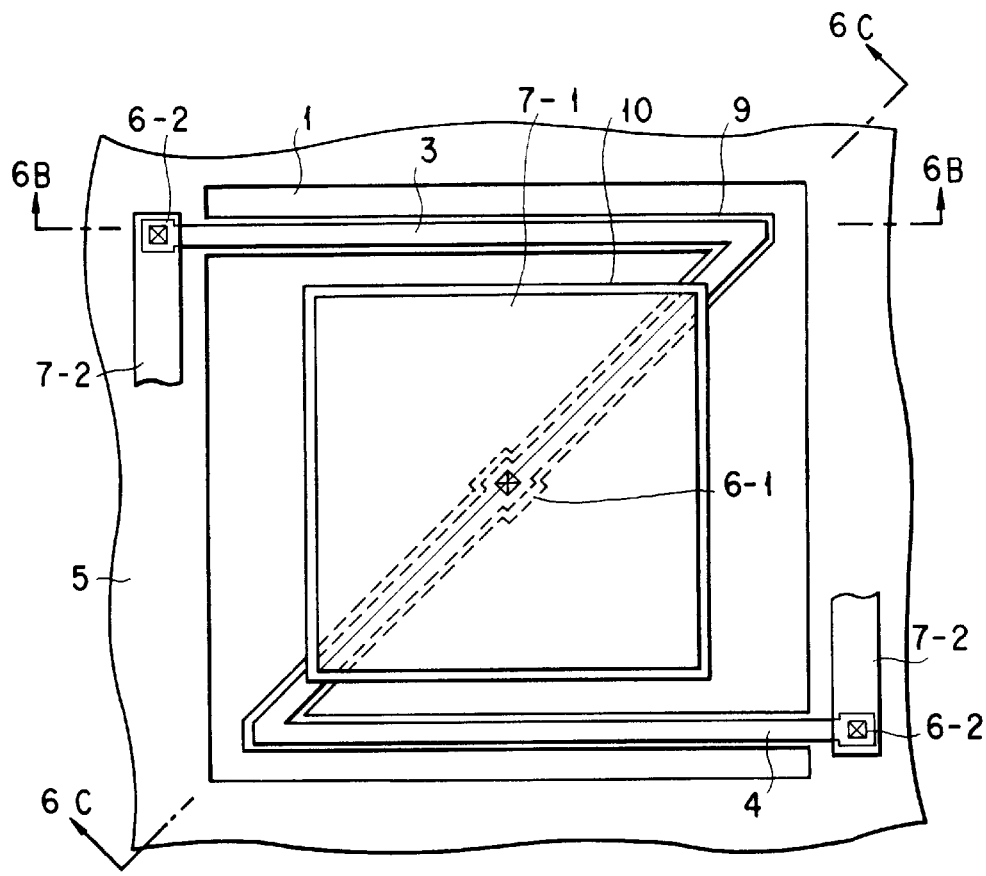
FIGS. 6A through 6C are a plan view and cross-sectional views depicting the structure of a unit pixel portion of an infrared solid-state image sensor according to a third embodiment.
Figure 6B:
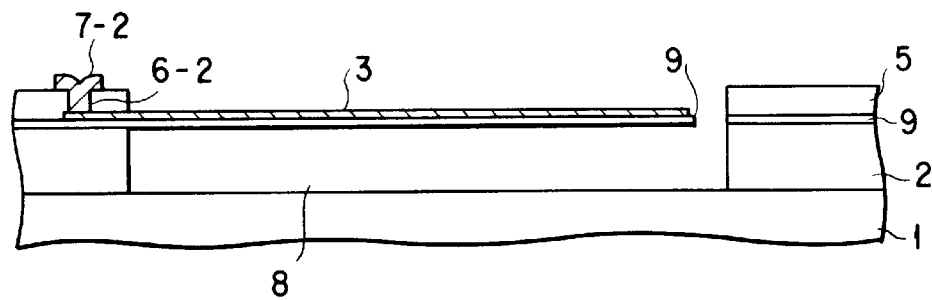
Figure 6C:
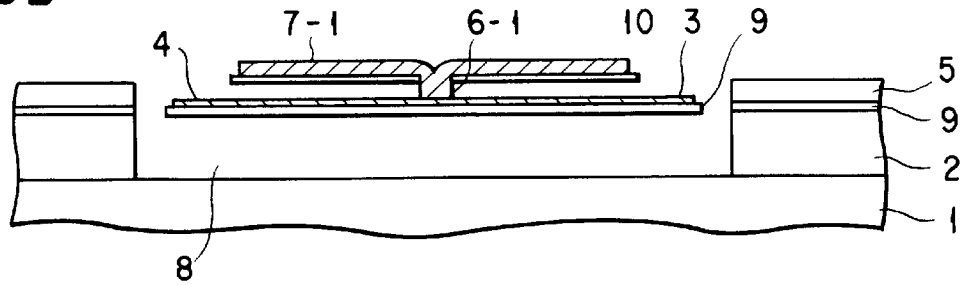

FIGS. 6A through 6C are exemplary diagrams for explaining the structure of a unit pixel portion of an infrared solid-state image sensor according to the third embodiment of the present invention. FIGS. 6A through 6C illustrate the structure of a unit pixel of a thermopile infrared solid-state image sensor. This unit pixel structure has a cavity structure 8 formed by etching a part of a silicon oxide film 2 on a silicon substrate 1 as a sacrificial layer. P-type polysilicon 3 and n-type polysilicon 4 are connected above the cavity structure 8 by a hot junction contact metal 7-1 such as aluminum.

FIG. 6A is a plan view of the unit pixel structure, and FIGS. 6B and 6C are cross-sectional views along the lines 6B—6B and 6C—6C in FIG. 6A.

A cold junction in FIGS. 6A to 6C has such a structure that metal (e.g., cold junction metal 7-2 such as aluminum) connected to the polysilicon film 3 or the thermocouple material is buried in silicon oxide films 2 and 5. Here, the cold junction metal 7-2 buried in the silicon substrate 1 is a cold junction.

In the structure in FIGS. 6A to 6C, incident infrared rays are also converted to heat by the infrared absorption layer, raising the temperatures of the infrared absorption layer and the hot junction metal 7-1, as per the first embodiment. As the cold junction metal 7-2 is cooled by the silicon substrate 1, the temperature does not rise.

The structure in FIGS. 6A to 6C differs from the second embodiment in that the first diaphragm 10, which supports the hot junction contact metal 7-1 of the thermocouples and the infrared absorption layer, and the second diaphragm 9, which supports the polysilicon wiring layers 3 and 4, the material for the thermocouples, are formed by different material layers. In the example in FIGS. 6A to 6C, the first diaphragm 10 and the second diaphragm 9 are both formed by a silicon nitride film.

In the structure in FIGS. 6A to 6C, it is only the second diaphragm 9 that has a support structure to the semiconductor substrate 1 as per the second embodiment. The first diaphragm 10, which supports the hot junction contact metal 7-1 of the thermocouples and the infrared absorption layer (not shown), is supported by the second diaphragm 9.

In the structure shown in FIGS. 6A to 6C, therefore, the first diaphragm 10, which supports the region whose temperature rises with absorption of infrared rays, is not directly supported on the semiconductor substrate 1. Therefore, an increase in the thermal conductance between the hot junction 7-1 and the cold junction 7-2 of the thermocouples, which would otherwise originate from the heat conduction of the first diaphragm 10, does not occur at all.

Let us compare the second embodiment with the third embodiment in the case of a typical structure where the infrared absorption layer (not shown) is so formed as to cover the hot junction metal 7-1 of the thermocouples. Then, the area of the hot junction metal 7-1 in the third embodiment is apparently larger than the area of the hot junction metal 7-1 in the second embodiment, so that the infrared absorption layer (not shown) in the third embodiment gets larger than that in the second embodiment.

The fill factor (FF=Sa/Sp) which is defined by the ratio of the area of a unit pixel, Sp, to the area of the infrared absorption layer, Sa, is improved more in the third embodiment than in the second embodiment.

The absorption power Pin in the infrared absorption layer is expressed as follows:

$$Pin = Pir \times A \times FF \times Sp$$

where Pir is the power of the incident infrared rays, Sp is the pixel area and A is the absorption coefficient of the infrared absorption layer.

Given that ΔT is a temperature difference across both ends of a thermocouple, the loss power Pout from the infrared absorption layer due to the thermal conductance G including that of the thermocouple wiring becomes as follows:

$$Pout = G \times \Delta T.$$

If there is no influence of the heat capacity in a sufficiently low frequency region, Pin=Pout. Then, $$Pir \times A \times FF \times Sa = G \times \Delta T.$$

In a case where only a pair of thermocouples are formed in a pixel as in the first to third embodiments, the output voltage Vout is expressed by $$Vout = S \times \Delta T = (Pir \times A \times FF \times Sa \times S)/G$$

where S is the Seebeck coefficient.

In other words, the fill factor FF can be increased more in the third embodiment than in the second embodiment, thereby ensuring an increase in the temperature rise of the heat sensing portion with respect to the same incident infrared light. This can permit an infrared solid-state image sensor with a higher sensitivity to be implemented.

The use of a silicon nitride film for the first diaphragm 10 as in the third embodiment permits the first diaphragm 10 not only to serve as a support plate but also to produce an effect of reducing the thermal conductances between the infrared absorption layer (not shown) and hot junction metal 7-1 and the polysilicon films 3 and 4 due to the following reason.

As shown in the cross-sectional structure in FIG. 6C, the sealing atmosphere that was provided at the time of packing the infrared solid-state image sensor is present in the cavity structure portion in the region where the first diaphragm 10 and the second diaphragm 9 overlap each other. The heat conduction under this atmosphere may cause a sensitivity drop.

In this case, the heat conduction through the atmosphere is proportional to the area of the overlapping region and is inversely proportional to the distance between the overlapped portions. Forming the first diaphragm by a silicon nitride film as in the structure of the third embodiment can allow the shape of the first diaphragm 10 to protrude downward. This provides a more preferable advantage of preventing the sensitivity from dropping from the heat conduction through the atmosphere.

The deformation of the diaphragm shape is originated from the following two kinds of physical phenomena. First, the internal stress of the silicon nitride film is greater than that of the hot junction metal 7-1 and is compressive stress. The other one is such that the coefficients of thermal expansion of the silicon nitride film and the hot junction metal differ from each other so that cooling after deposition of the silicon nitride film causes the hot junction metal to contract.

For instance, the internal stress of the silicon nitride film that is deposited by plasma CVD is compressive stress of approximately 1000 MPa, considerably greater than the internal stress of aluminum of approximately 0.001 MPa or the internal stress of titanium of approximately 0.0001 MPa.

The thermal expansion coefficients (coefficients of linear expansion) of those materials are respectively $5 \times 10^{-7}$ K$^{-1}$, $2.5 \times 10^{-5}$ K$^{-1}$ and $8.5 \times 10^{-6}$ K$^{-1}$. Therefore, the deformation of the silicon nitride film is the smallest. The contraction of the hot junction metal therefore causes the diaphragm to deform like a downward protrusion.

Using the various constants given above, when the length of the diaphragm 10 in the cross section in FIG. 6C (the orthogonal length of the diaphragm 10 in FIG. 6A) is 50 μm, for example, the above two effects make the edge portions of the diaphragm 10 balanced at a position approximately 5 μm higher than the one shown in FIG. 6C.

Because of the same reason, the use of a silicon nitride film for all the diaphragms 9 and 10 in the first to third embodiments can increase the clearance between the diaphragm 9 and the semiconductor substrate 1. This structure is more preferable as it can prevent the sensitivity from being reduced by the heat conduction through the aforementioned atmosphere.

Of course, with the structure of any of the first to third embodiments as the basic structure, the polysilicon wiring length L can be made longer by designing the polysilicon films 3 and 4 and the second diaphragm 9 to fold back over the cavity structure 8. This scheme can easily reduce the thermal conductance between the hot junction and cold junction of the thermocouples. The scheme can thus further improve the infrared ray sensitivity, which is more preferable.

Although a silicon nitride film is used as the material for the second diaphragm 9 in the first to third embodiments, the use of a silicon oxide film for the diaphragm allows the thermocouples and the infrared absorption layer (not shown) to be shaped in such a way as to be supported by the thermocouple wirings 3 and 4, the hot junction metal 7-1 and the infrared absorption layer in the structure in FIGS. 4A to 4C.

In this case, the diaphragm itself is eliminated, so that the diaphragm originated increase in thermal conductance between the hot junction and cold junction does not occur. Thus, the thermal conductance is decreased, further increasing the sensitivity.

In the first to third embodiments, the silicon substrate 1 is illustrated as an etching stopper in the etching process of forming the cavity structure 8 in the silicon oxide film 2. If a layer of a material which has an etching selectivity to the silicon oxide film 2 like a silicon nitride film is formed at a position equivalent to the interface between the silicon substrate 1 and the silicon oxide film 2, however, a structure can be placed freely between this silicon nitride film and the silicon substrate 1.

Further, metal silicide, such as molybdenum silicide, may be used for the contact metals 7-1 and 7-2. This modification is more preferable because, due to metal silicides generally having high chemical resistances, a hydrofluoric acid solution or the like which has a fast etching speed can be used.

Fourth Embodiment

Figure 7A:
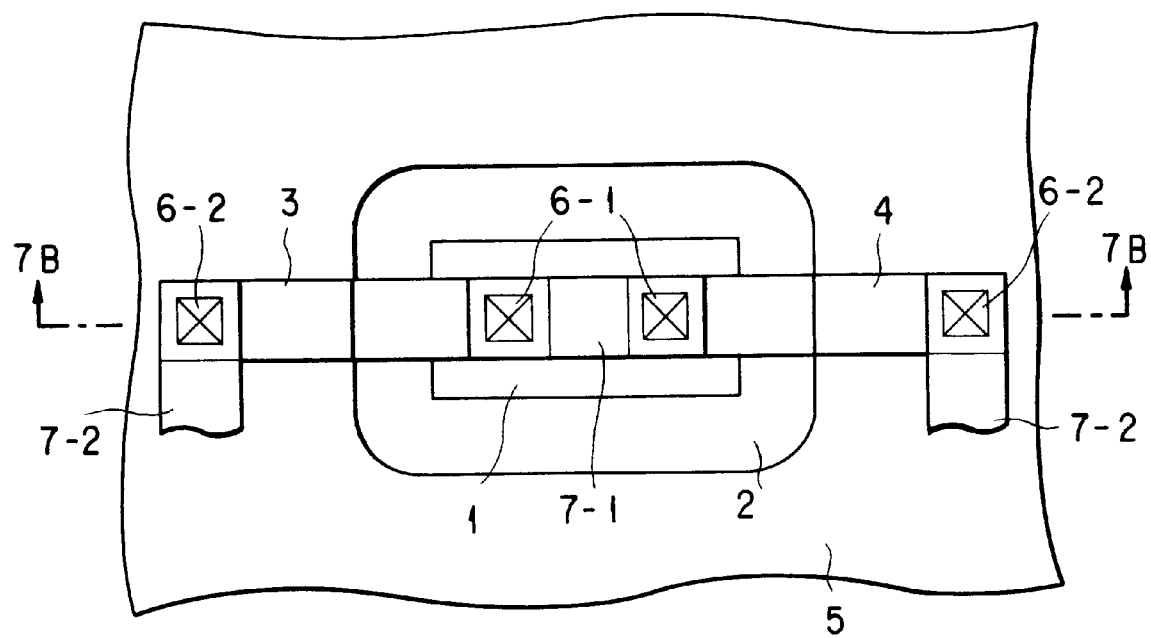
FIGS. 7A and 7B are a plan view and a cross-sectional view illustrating the structure of a unit pixel portion of an infrared solid-state image sensor according to a fourth embodiment.
Figure 7B:
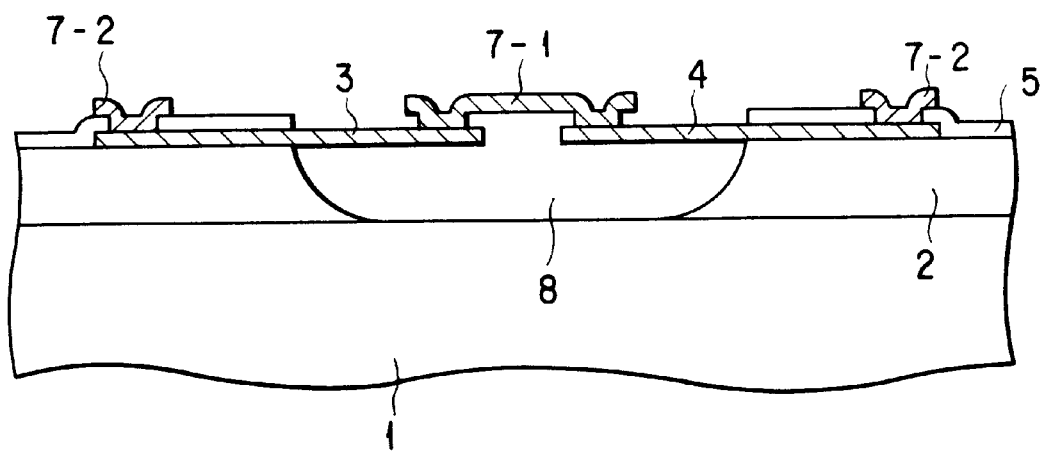

FIGS. 7A and 7B are exemplary diagrams for explaining the structure of a unit pixel portion of an infrared solid-state image sensor according to the fourth embodiment of the present invention. FIGS. 7A and 7B illustrate the structure of a unit pixel of a thermocouple infrared solid-state image sensor. This unit pixel structure has a cavity structure 8 formed by etching a part of a silicon oxide film 2 on a silicon substrate 1 as a sacrificial layer. P-type polysilicon 3 and n-type polysilicon 4 are connected above the cavity structure 8 via a hot junction contact hole 6-1 by a hot junction contact metal 7-1 like aluminum.

FIG. 7A is a plan view of the unit pixel structure, and FIG. 7B is a cross-sectional view along the line 7B—7B in FIG. 7A.

A cold junction in FIGS. 7A and 7B has such a structure that cold junction metal 7-2 (e.g., aluminum and the like), which is connected via a cold junction contact 6-2 to the polysilicon films 3 and 4 as the thermocouple materials is buried in silicon oxide films 2 and 5. Here, the cold junction metal 7-2 buried in the silicon substrate 1 is a cold junction.

In the structure in FIGS. 7A and 7B, incident infrared rays are converted to heat by the infrared absorption layer, raising the temperatures of the infrared absorption layer and the hot junction metal 7-1. As the cold junction metal 7-2 is cooled by the silicon substrate 1, the temperature does not rise. Therefore, a temperature difference proportional to the amount of the incident infrared rays is produced between the hot junction and the cold junction, and is converted to a potential difference between the hot junction and cold junction by the Seebeck effect. This potential difference is then output.

Figure 1:
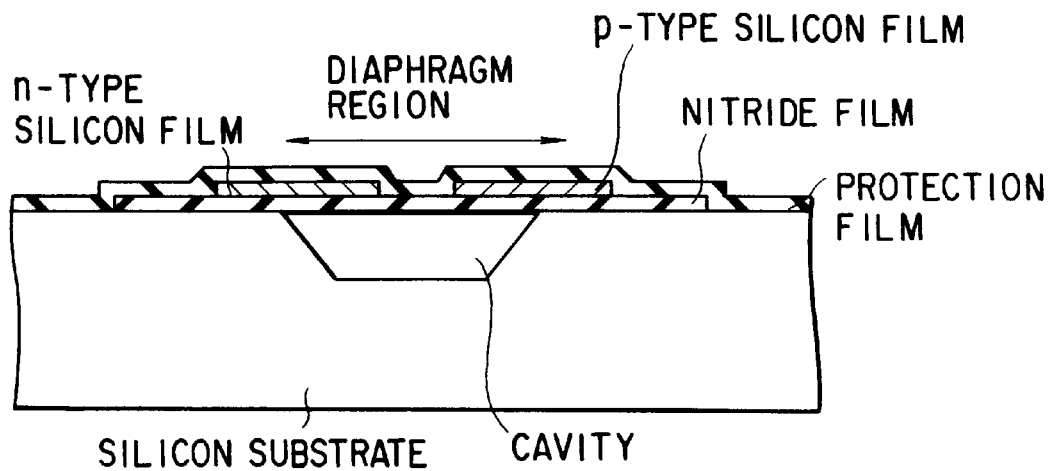
FIG. 1 is a cross-sectional view illustrating the structure of a unit pixel portion of a conventional infrared solid-state image sensor.
Figure 2:
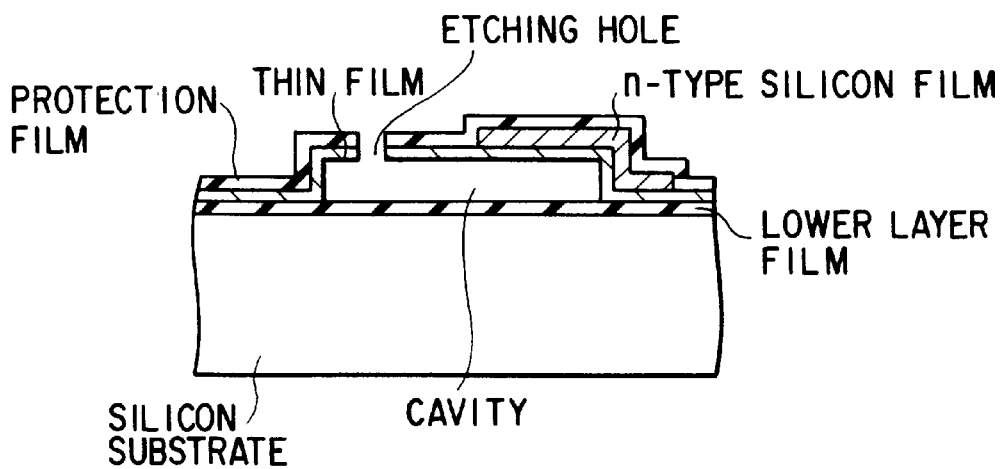
FIG. 2 is a cross-sectional view showing the structure of a unit pixel portion of another conventional infrared solid-state image sensor.

The fourth embodiment considerably reduces the heat capacity of the hot junction metal 7-1 and the thermal conductance G between the hot junction and cold junction as compared with the conventional structures shown in FIGS. 1 and 2.

In the structure in FIGS. 7A and 7B, the support member for thermally isolating the hot junction metal 7-1 by means of the cavity structure 8 as a heat sink that is located between the hot junction metal 7-1 and the silicon substrate 1 is the polysilicon films 3 and 4 or the thermocouple materials themselves.

In the structure in FIGS. 7A and 7B, the heat capacity of the hot junction metal 7-1 is determined only by the hot junction metal 7-1 and a part of the polysilicon films 3 and 4 which are thermocouple materials. That is, the structure in FIGS. 7A and 7B does not cause increases in the thermal conductance G and the heat capacity C, which would be caused by the presence of the support members in the prior arts, and can ensure infrared solid-state image sensing with a higher sensitivity than the conventional structures.

It is needless to say that this embodiment can achieve a high sensitivity by reducing the heat capacity and thermal conductance in a case where a plurality of thermocouples are connected in series as well as in a bolometer infrared solid-state image sensor.

In the case of the structure shown in FIGS. 7A and 7B where the heat capacity and thermal conductance are determined by the thermocouple materials themselves, the series connection of thermocouples as employed in an ordinary thermopile infrared solid-state image sensor becomes no longer adequate as means for improving the sensitivity.

When N structures in FIGS. 7A and 7B taken as basic thermocouple structures are connected in series, the thermal conductance is expressed by N·G, and the heat capacity is likewise expressed by N·C. Substituting those values in the equation 1 cancel out the term of N. In other words, with the use of the structure in FIGS. 7A and 7B, the series connection of N thermocouples does not properly serve as means to improve the sensitivity, but rather it is desirable to use the structure in FIGS. 7A and 7B as a single pixel structure in view of miniaturization of pixels.

Fifth Embodiment

Figure 8A:
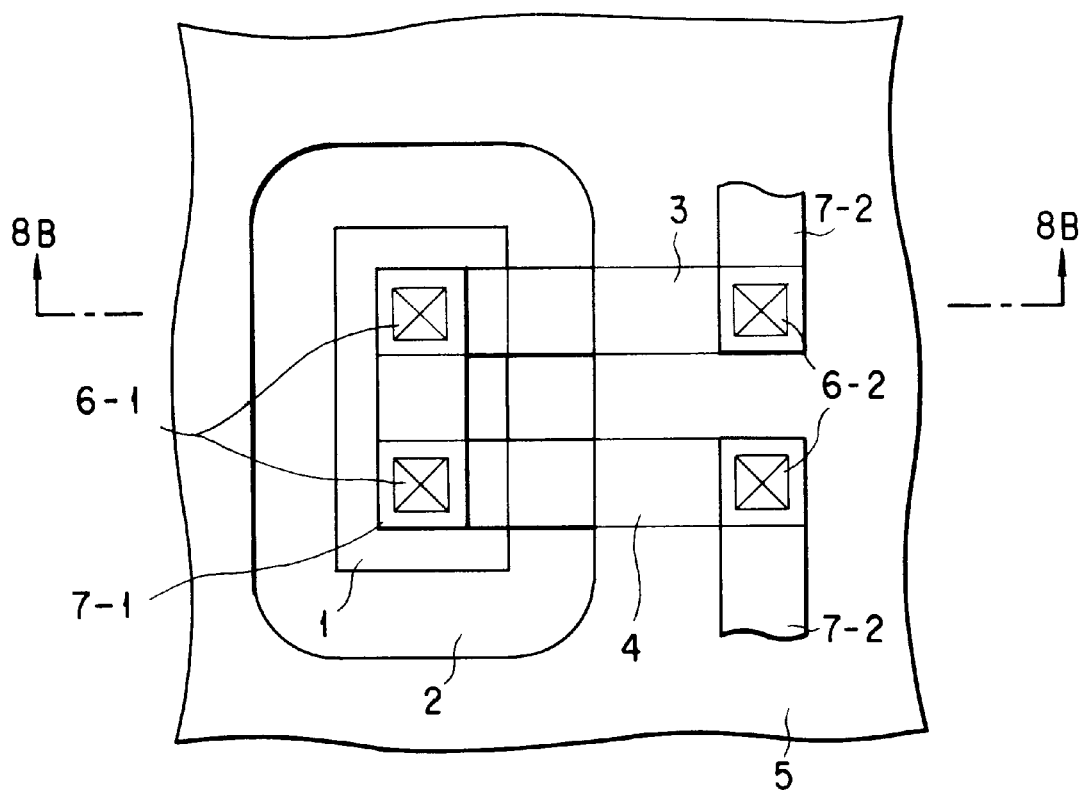
FIGS. 8A and 8B are a plan view and a cross-sectional view illustrating the structure of a unit pixel portion of an infrared solid-state image sensor according to a fifth embodiment.
Figure 8B:
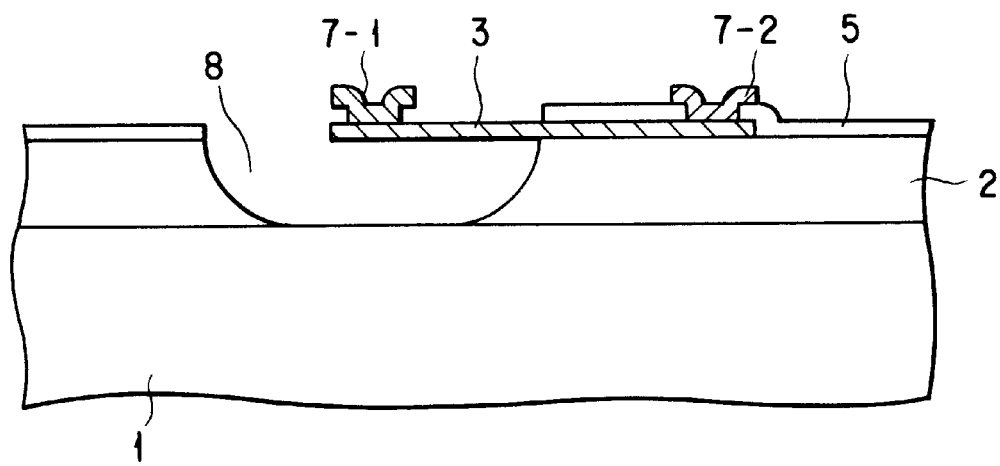

FIGS. 8A and 8B are exemplary diagrams for explaining an infrared solid-state image sensor according to the fifth embodiment of the present invention. FIG. 8A is a plan view of a unit pixel structure, and FIG. 8B is a cross-sectional view along the line 8B—8B in FIG. 8A.

The pixel structure of the infrared solid-state image sensor shown in FIGS. 8A and 8B is basically equivalent to that shown in FIGS. 7A and 7B. The fifth embodiment differs from the fourth embodiment in the arrangement of the thermocouples. Further, a p-type polysilicon film 3 and an n-type polysilicon film 4 are arranged in parallel, cold junction metals 7-2 are arranged adjacent to each other.

The structure in FIGS. 8A and 8B is advantageous in that a square planar structure or a square pixel can easily be constructed. Further, the influence of expansion by a temperature change of the polysilicon films 3 and 4 as thermocouple materials can be absorbed by the space on the left-hand side in FIGS. 8A and 8B.

In the fourth and fifth embodiments, the silicon substrate 1 is used as an etching stopper in the etching process of forming the cavity structure 8 in the silicon oxide film 2. If a layer of a material which has an etching selectivity to the silicon oxide film 2 like a silicon nitride film is formed at a position equivalent to the interface between the silicon substrate 1 and the silicon oxide film 2, however, a structure can be placed freely between this silicon nitride film and the silicon substrate 1.

A manufacturing process for acquiring the structures of the infrared solid-state image sensors of the fourth and fifth embodiments will now be explained with reference to FIGS. 9A to 9E, with the structure in FIGS. 8A and 8B taken as example. In the following description, however, steps of forming signal reading means which is not concerned with the thermoelectric conversion means will be omitted.

As shown in FIG. 9A, the silicon oxide film 2 is formed 1 μm thick on the silicon substrate 1. While the silicon oxide film 2 may be formed by thermal oxidization or CVD, it is more preferable to form the silicon oxide film 2 at the same time as a thick oxide film for isolation of a signal reading circuit (not shown) in order to shorten the overall manufacturing process.

Next, the p-type polysilicon film 3 is formed in a desired shape as a thermocouple material as shown in FIG. 9B. For example, an undoped polysilicon film is deposited 50 nm thick by LP-CVD. Then, ion implantation of boron as a p-type impurity with a dose of $1 \times 10^{15}$ cm$^{-2}$ at 15 kV is carried out. Then, a heat treatment is performed at 800° C. in the nitrogen gas atmosphere to activate the impurity. To form a desired pattern, RIE etching is then carried out by using a desired resist pattern formed by photolithography as a mask. This forms a pattern of the p-type polysilicon film 3 with a boron concentration of $2 \times 10^{19}$ cm$^{-3}$.

Although not illustrated in FIGS. 9A to 9E, the n-type polysilicon film 4 can be formed by steps similar to those for the p-type polysilicon film 3, with a difference of ion-implanting an n-type impurity, e.g., phosphorus.

Next, as shown in FIG. 9C, a silicon oxide film 5 is formed 50 nm thick on the polysilicon films 3 and 4 by, for example, LP-CVD, the hot junction contact hole 6-1 and cold junction contact hole 6-2 are formed by RIE or the like.

Then, as shown in FIG. 9D, aluminum, for example, is deposited 100 nm thick by sputtering to form the hot junction contact metal 7-1 and the cold junction contact metal 7-2, which are then patterned into desired shapes by RIE or the like.

Finally, a resist 9 for forming the cavity structure 8 (not shown in FIGS. 9A to 9E) is formed as shown in FIG. 9E. With this resist 9 as a mask, the silicon oxide films 2 and 5 are isotropically etched by an etching scheme which has an etching selectivity to the contact metals 7-1 and 7-2 and the polysilicon films 3 and 4. As a result, the structure whose cross section is illustrated in FIGS. 8A and 8B can be acquired.

When aluminum is used for the contact metals 7-1 and 7-2, for example, a mixed etching solution of acetic acid and ammonium fluoride by a ratio of 1:2 can be used in selective etching to form the cavity structure 8. For the silicon oxide films having a thickness of 1 μm, the cavity structure 8 can be formed through etching for about six minutes at the room temperature.

Further, metal silicide, such as molybdenum silicide, may be used for the contact metals. This modification is more preferable because a hydrofluoric acid solution or the like which has a fast etching speed can be used due to metal silicides generally having high chemical resistances.

Sixth Embodiment

Figure 10A:
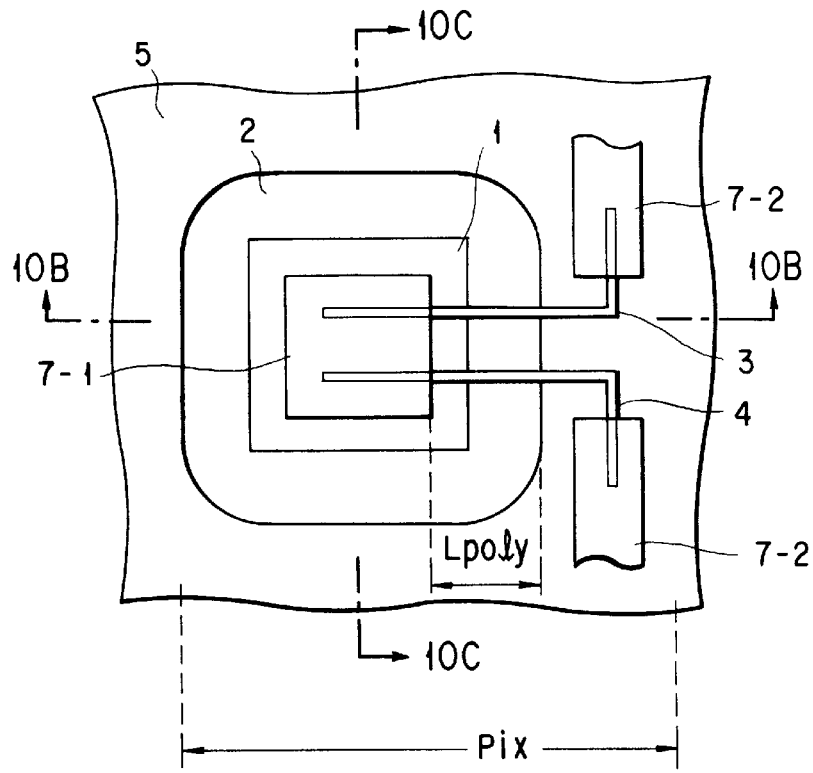
FIGS. 10A through 10C are a plan view and cross-sectional views showing the structure of a unit pixel portion of an infrared solid-state image sensor according to a sixth embodiment.
Figure 10B:
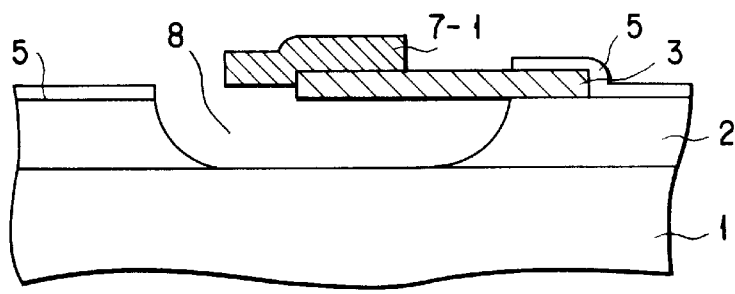
Figure 10C:
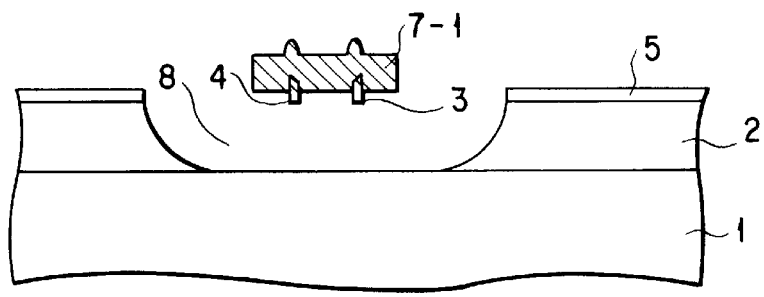

FIGS. 10A through 10C are exemplary diagrams for explaining the structure of a unit pixel portion of an infrared solid-state image sensor according to the sixth embodiment of the present invention. FIGS. 10A to 10C illustrate the structure of a unit pixel of a thermopile infrared solid-state image sensor. This unit pixel structure has a cavity structure 8 formed by etching a part of a silicon oxide film 2 on a silicon substrate 1 as a sacrificial layer. P-type polysilicon 3 and n-type polysilicon 4 are connected above the cavity structure 8 via a hot junction contact hole 6-1 by a hot junction contact metal 7-1 like aluminum.

FIG. 10A is a plan view of the unit pixel structure, and FIGS. 10B and 10C are cross-sectional views along the lines 10B—10B and 10C—10C in FIG. 10A, respectively.

A cold junction in FIGS. 10A to 10C has such a structure that cold junction metal 7-2 (e.g., aluminum and the like), which is connected to the polysilicon films 3 and 4 as the thermocouple materials is buried in silicon oxide films 2 and 5. The silicon substrate 1 is a cold junction.

In the structure in FIGS. 10A to 10C, incident infrared rays are converted to heat by the infrared absorption layer, raising the temperatures of the infrared absorption layer and the hot junction metal 7-1. As the cold junction metal 7-2 is cooled by the silicon substrate 1, the temperature does not rise. Therefore, a temperature difference proportional to the amount of the incident infrared rays is produced between the hot junction and the cold junction, and is converted to a potential difference between the hot junction and cold junction by the Seebeck effect. This potential difference is then output.

The sixth embodiment significantly reduces the heat capacity of the hot junction metal 7-1 and the thermal conductance G between the hot junction and cold junction as compared with the conventional structures shown in FIGS. 1 and 2.

In the structure in FIGS. 10A to 10C, the support member for thermally isolating the hot junction metal 7-1 by means of the cavity structure 8 as a heat sink that is located between the hot junction metal 7-1 and the silicon substrate 1 is the polysilicon films 3 and 4 or the thermocouple materials themselves.

In the structure in FIGS. 10A to 10C, the heat capacity of the hot junction metal 7-1 is determined only by the hot junction metal 7-1 and a part of the polysilicon films 3 and 4 which are thermocouple materials. That is, the structure in FIGS. 10A to 10C does not cause increases in the thermal conductance G and the heat capacity C, which would be caused by the presence of the support members in the prior arts, and can ensure infrared solid-state image sensing with a higher sensitivity than the conventional structures.

It is needless to say that this embodiment can achieve a high sensitivity by reducing the heat capacity and thermal conductance in a case where a plurality of thermocouples are connected in series as well as in a bolometer infrared solid-state image sensor.

In the case of the structure shown in FIGS. 10A to 10C where the heat capacity and thermal conductance are determined by the thermocouple materials themselves, the series connection of thermocouples as employed in an ordinary thermopile infrared solid-state image sensor becomes no longer adequate as means for improving the sensitivity.

When N structures in FIGS. 10A to 10C taken as basic thermocouple structures are connected in series, the thermal conductance is expressed by N·G, and the heat capacity is likewise expressed by N·C. Substituting those values in the equation 1 cancel out the term of N. In other words, with the use of the structure in FIGS. 10A to 10C, the series connection of N thermocouples does not properly serve as means to improve the sensitivity, but rather it is desirable to use the structure in FIGS. 10A to 10C as a single pixel structure in view of miniaturization of pixels.

FIGS. 10A to 10C show the use of a single thermocouple as thermoelectric conversion means, and also such a feature that the polysilicon films 3 and 4 as the thermocouple materials are processed finely as well as a feature of the thermocouple serving to support itself above the cavity structure. With regard to the cross-sectional shapes of the polysilicon films 3 and 4, those films 3 and 4 are patterned to have elongated cross sections each with the height greater than the width, as shown in FIG. 10C.

The cross-sectional structure in FIG. 10C can considerably suppress the displacement of the hot junction at the time of supporting the hot junction as mentioned earlier. That is, the mechanical strength is improved significantly, considerably enhancing the durability against mechanical shocks applied from outside the infrared solid-state image sensor. As the polysilicon films 3 and 4 are finely processed, the cross-sectional areas can be reduced significantly. This results in a considerable reduction in the thermal conductance G between the hot junction 7-1 and cold junction 7-2 of the thermocouples, thus greatly improving the sensitivity of the infrared solid-state image sensor.

The sixth embodiment shown in FIGS. 10A to 10C will now be compared with the prior arts from the viewpoint of sensitivity. While the sensitivity of a thermopile infrared solid-state image sensor is given in the equation 1, the substantial sensitivity of a solid-state image sensing apparatus having thermopiles arranged two-dimensionally is the sensitivity that is a product of the fill factor FF=Sdetect/Spixel, which is defined as a ratio of the detection area Sdetect for actually detecting infrared light to the unit pixel area Spixel, and the sensitivity R given by the equation 1.

Of course, the actual sensitivity R·FF can be improved by optically increasing the fill factor by condensing the light incident to the pixel portion to the detecting portion by means of a microlens, an optical system formed for each pixel. In an infrared solid-state image sensor of a thermoelectric conversion type, which has a cavity structure inside, it is very hard to form such microlenses. In the following description of computation, therefore, comparison will be given on the assumption that no optical means or improving the fill factor is provided.

In effecting comparison on the sensitivity R, a sensitivity drop caused by an increase in the modulation frequency of the incident light should be considered. In the following calculation, however, comparison will be made with respect to a sufficiently low frequency region where the influence of the modulation frequency of the incident light does not appear. Further, a blackening film of gold with an absorption coefficient of about 0.9 is formed as a film to improve the absorptance of infrared light at the detecting portion.

Let us consider, as the first conventional structure, a thermopile infrared solid-state image sensor which has a pixel area Spixel of $100 \times 100 = 10^4$ $\mu m^2$, the number of series-connected thermocouples N=32, the width of polysilicon as the thermocouple material, Wpoly=0.6 $\mu m$, and the height thereof Hpoly=0.07 $\mu m$, has a silicon oxide film formed as a support layer for the thermocouples and a cavity structure formed by etching the polysilicon sacrificial layer (Toshio Kanno, et al., Proc. SPIE vol. 2269, pp. 450–459, 1994). The sensitivity R for this conventional structure, reported, is 1550 V/W. For this device, the fill factor FF is approximately 10%, and the substantial sensitivity is R·FF=155 V/W.

With regard to the fine pixel structure as shown in FIGS. 8A and 8B as a comparative example, the pixel size is Pix=5.6 $\mu m$, the distance between the hot junction and cold junction is Lpoly=1.2 $\mu m$, the polysilicon width is Wpoly=0.8 $\mu m$, the polysilicon thickness is Hpoly=0.05 $\mu m$, and series connection of thermocouples is not employed, i.e., N=1.

For this pixel structure, the fill factor FF is 6.1%, and the substantial sensitivity is R·FF=4.8 V/W or the sensitivity is considerably dropped by the miniaturization. This results from an increase in thermal conductance G which comes from the fact that while the distance between the hot junction and cold junction is shortened to Lpoly=1.2 $\mu m$ by the miniaturization, the polysilicon width Wpoly and the polysilicon thickness Hpoly are not made smaller.

According to the structure in FIGS. 10A to 10C or the sixth embodiment of the present invention, while minute pixels with the pixel size Pix and the distance Lpoly between the hot junction and cold junction are the same as those in FIGS. 8A and 8B, an increase in thermal conductance G is suppressed by finely processed polysilicon. This structure therefore considerably suppresses a sensitivity drop.

Specifically, the structure has the polysilicon width Wpoly=0.05 [$\mu m$] and the thickness Hpoly=0.1 [$\mu m$] and a cross section as shown in FIG. 10C. Accordingly, the polysilicon cross-sectional area Spoly is significantly reduced to $4.46 \times 10^{-15}$ [$m^2$], providing the substantial sensitivity R·FF=57 [V/W]. This value is not so low if one compares it with the sensitivity for the large pixel structure of the first prior art which has a pixel size of 100 $\mu m$.

If reduction of the pixel size down to 5.6 $\mu m$ is not required, the sensitivity is improved further. If the scale of the structure in FIGS. 10A to 10C is simply increased to two times, or three times, it is possible to achieve a high value of R·FF=114 V/W for 11.2 $\mu m$ pixels or R·FF=171 V/W for 16.8 $\mu m$ pixels with the minute pixel structure.

In FIGS. 10A to 10C and FIGS. 8A and 8B, the silicon substrate 1 is illustrated as an etching stopper in the etching process of forming the cavity structure 8 in the silicon oxide film 2. If a layer of a material which has an etching selectivity to the silicon oxide film 2 like a silicon nitride film is formed at a position equivalent to the interface between the silicon substrate 1 and the silicon oxide film 2, however, a structure can be placed freely between this silicon nitride film and the silicon substrate 1.

Seventh Embodiment

A manufacturing process for the infrared solid-state image sensors according to the sixth embodiment of the invention will now be explained with reference to FIGS. 11A through 13D. In the following description, however, steps of forming signal reading means which is not associated with the thermoelectric conversion means will not be discussed.

Figure 11A:
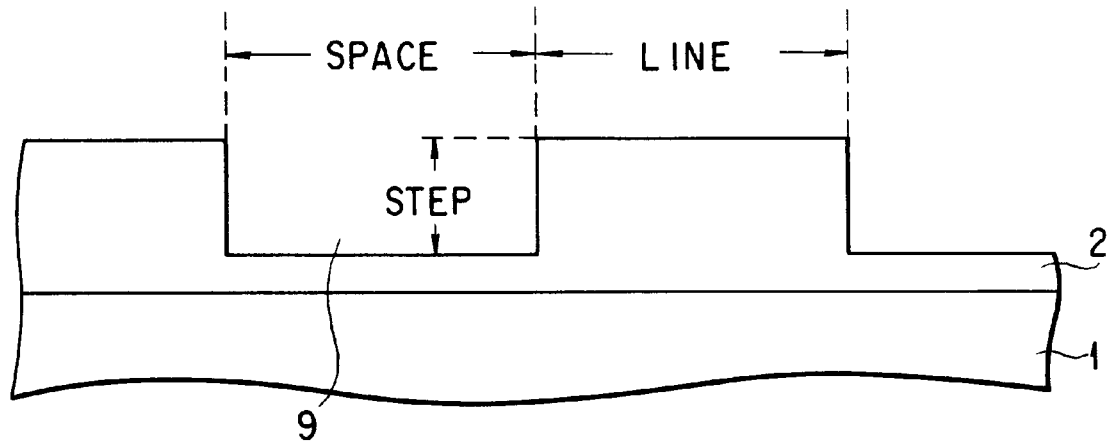
FIGS. 11A through 11C are cross-sectional views showing manufacturing steps for the infrared solid-state image sensor according to the sixth embodiment.
Figure 11B:
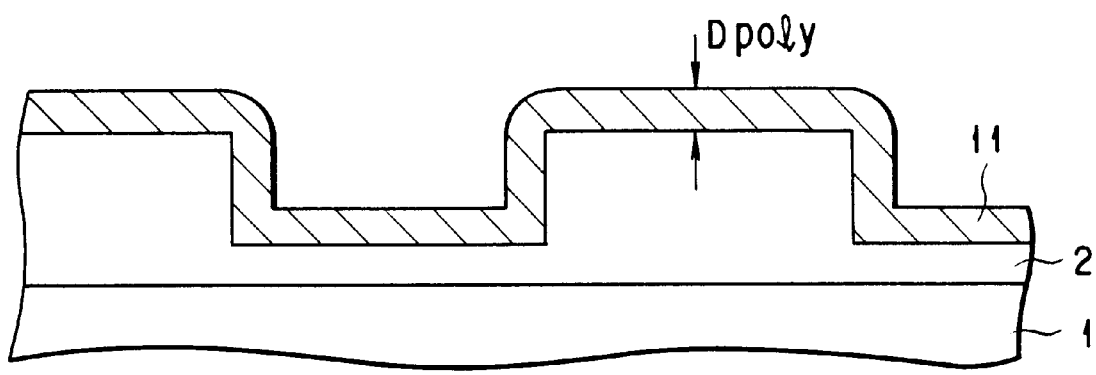
Figure 11C:
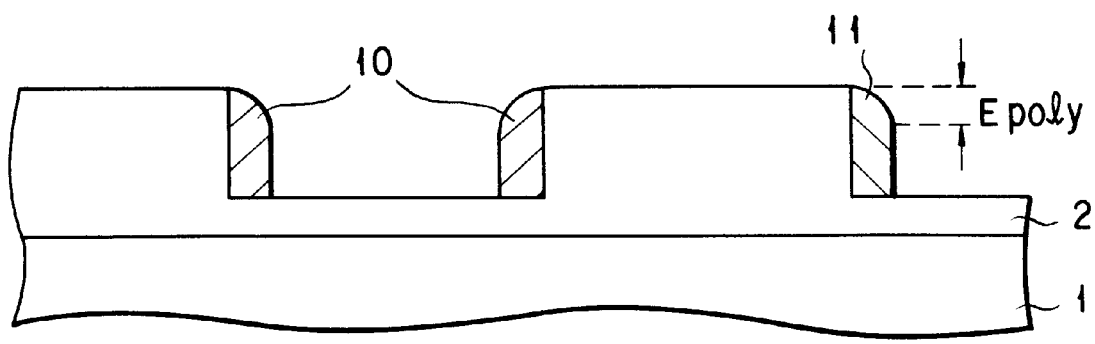
Figure 12A:
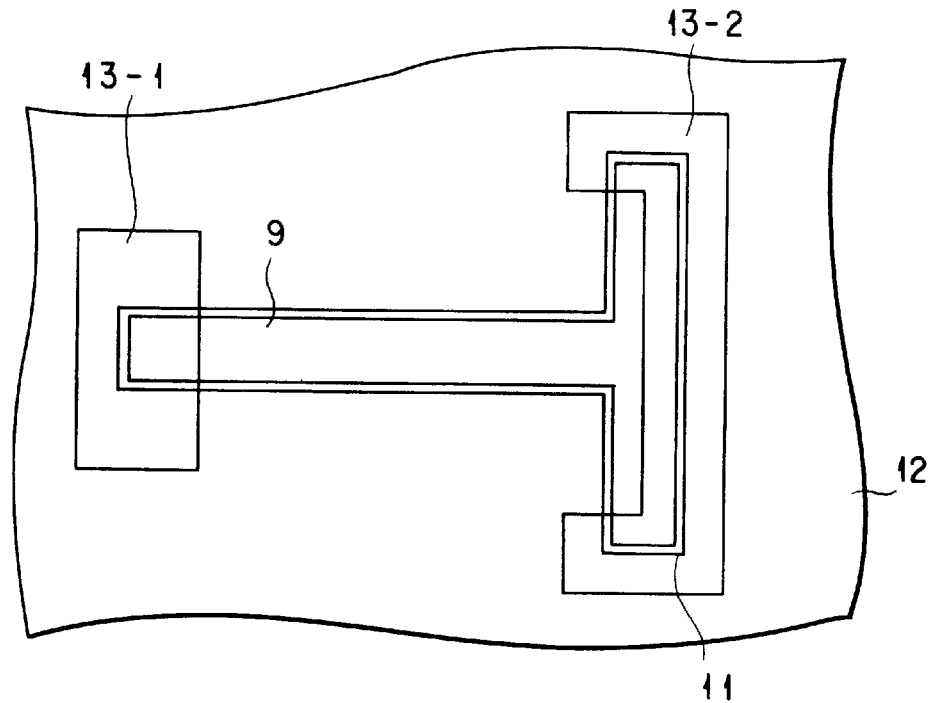
FIGS. 12A and 12B are plan views depicting the manufacturing steps for the infrared solid-state image sensor according to the sixth embodiment.
Figure 12B:
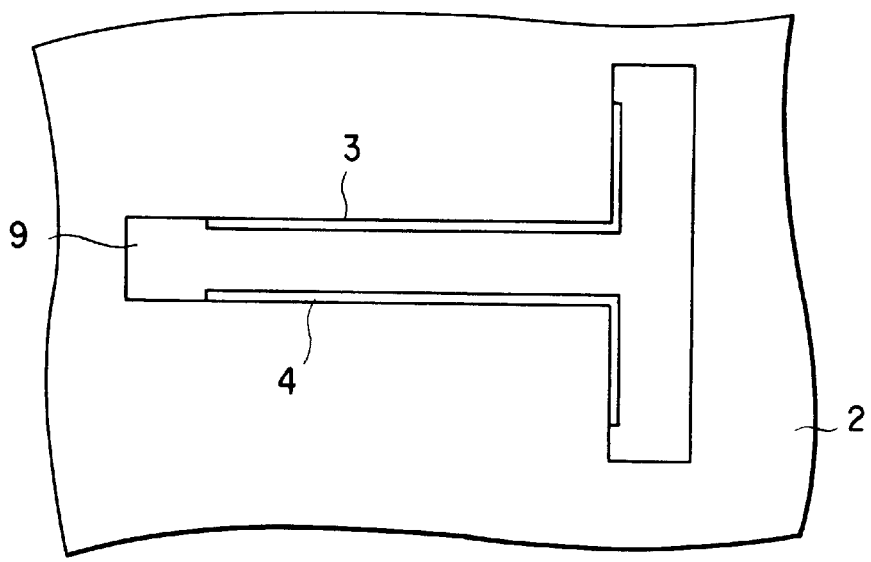

FIGS. 11A to 11C are exemplary diagrams for explaining how to carry out fine processing of polysilicon films which are materials for thermocouples of the infrared solid-state image sensor. FIGS. 12A and 12B are exemplary diagrams for explaining a processing scheme of isolating the finely processed polysilicon films, the material for thermocouples of the infrared solid-state image sensor, in the vicinity of the hot junction and cold junction. FIGS. 13A to 13D are exemplary diagrams for explaining how to connect the polysilicon films or the materials for thermocouples of the infrared solid-state image sensor, at the hot junction.

Fine processing of a polysilicon film will now be discussed with reference to FIGS. 11A to 11C. First, the silicon oxide film 2 is formed 1 $\mu m$ thick on the silicon substrate. While the silicon oxide film 2 may be formed by thermal oxidization or CVD, it is more preferable to form the silicon oxide film 2 at the same time as a thick oxide film for isolation of a signal reading circuit (not shown) in order to shorten the overall manufacturing process.

FIGS. 11A to 11C are cross-sectional views substantially equivalent to one with an enlarged portion corresponding to the vicinity of the hot junction 7-1 of the thermocouples in FIG. 10A. FIG. 11A shows a step structure formed in a sacrificial layer 2 which consists of a silicon oxide film for fine formation of the polysilicon film.

In FIG. 11A, the step on the sacrificial layer 2 is formed to the size limited by photolithography, Line being the width of a resist formed at the time of processing the sacrificial layer, Space being the width of the resist to be removed. Step indicates the height of the step of the step structure on the sacrificial layer 2, and a recess in the step structure is denoted by "9."

As shown in FIG. 11B, a polysilicon film 11 is deposited with a thickness=Dpoly in a conformal manner on the step-formed sacrificial layer 2 by, for example, low pressure CVD as isotropic film forming scheme.

Then, the polysilicon film 11 is etched by RIE or the like which is anisotropic etching that has a selectivity to the sacrificial layer 2, yielding a finely processed polysilicon structure in FIG. 11C. Epoly indicates the amount of etching of the polysilicon film 11. It is understood that the polysilicon structure shown in FIG. 11C has the same shape as the polysilicon structure shown in FIG. 10C.

The cross-sectional structure of the completed polysilicon film 11, when defined by the height Hpoly and width Wpoly, is expressed as follows.

$$H\text{poly}=S\text{tep}+D\text{poly}-E\text{poly}$$

$$W\text{poly}=D\text{poly}$$

Polysilicon can be processed finely without depending on Line or Space in FIG. 11A which is the processing limit of the photolithography. This formation can be controlled easily by process parameters such as Step, Dpoly and Epoly, which are easily controllable.

With reference to FIGS. 12A and 12B, a description will now be given of a scheme of isolating the polysilicon film 11, finely processed as shown in FIGS. 11A to 11C, at the hot junction and cold junction. FIGS. 12A and 12B are views of plan structures substantially equivalent to the plan structure in FIG. 10A, and illustrates how to form a polysilicon structure for the pixel structure shown in FIG. 10A.

The plan view of the pixel portion when the polysilicon structure shown in FIG. 11C is completed is equivalent to FIG. 12A; the finely processed polysilicon film 11 is formed on the side wall portions of the recess 9 inside the sacrificial layer 2.

As shown in FIG. 12A, a resist pattern 12 formed with an opening for a resist opening 13-1 near the hot junction and an opening for a resist opening 13-2 near the cold junction is formed.

With this resist used as a mask, the polysilicon film 11 is subjected to etching which has a selectivity to the sacrificial layer 2, thus forming the polysilicon films 3 and 4 isolated from each other, as shown in FIG. 12B. The isolated polysilicon films 3 and 4 are independently doped with impurities by, for example, ion implantation. As a result, the polysilicon films 3 and 4 respectively doped into a p-type and an n-type are yielded.

For example, ion implantation of boron as a p-type impurity with a dose of $1\times10^{15}$ cm$^{-2}$ at 15 kV is carried out, then a heat treatment is performed at 800° C. in the nitrogen gas atmosphere to activate the impurity. This completes a pattern of the p-type polysilicon film 3 with a boron concentration of $2\times10^{19}$ cm$^{-3}$. The n-type polysilicon film 4 can be formed by steps similar to those for the p-type polysilicon film 3, with an n-type impurity, e.g., phosphorus, to be ion-implanted.

Then, the hot junction contact hole 6-1 and cold junction contact hole 6-2 are formed by RIE or the like, and aluminum, for example, is deposited 100 nm thick as the hot junction contact metal 7-1 and the cold junction contact metal 7-2 by sputtering or the like. The contact metals are then processed into desired patterns by RIE or the like, thus completing the thermocouples. In this embodiment, the polysilicon films 3 and 4 are connected to the contact metals 7-1 and 7-2 by a method slightly different from the concept of so-called contact holes. This method will now be discussed referring to FIGS. 13A to 13D.

FIGS. 13A to 13D show the sacrificial layer of silicon oxide additionally formed on the polysilicon films 3 and 4, which have been formed by the scheme illustrated in FIGS. 11A to 11C, and the surface being planarized by polishing, reflow, etching or the like. FIGS. 13A and 13B are nearly equivalent to FIGS. 11A to 11C.

The hot junction contact 6-1 and cold junction contact 6-2 are to be formed on the device having the shape shown in FIG. 13A. Since the polysilicon films 3 and 4 which are to be connected are processed much more finely than are allowed by lithography in this embodiment, so-called contact holes cannot be formed.

Therefore, the sacrificial layer 2 is etched at a location equivalent to a region slightly bigger than the region of the hot junction metal 7-1 shown in FIG. 13D.

In the following description concerning FIGS. 13A to 13D, a discussion will take place on the assumption that the entire region illustrate is equivalent to a contact hole.

FIG. 13B presents a cross-sectional view of the pixel region with the structure shown in FIG. 13A after the sacrificial layer 2 is etched by the desired amount by using a resist pattern equivalent to a contact hole defined by photolithography as a mask.

Then, a contact metal, for example, aluminum is deposited 100 nm thick by sputtering or the like, and is then processed into the desired pattern by RIE or the like, completing the thermocouple as shown in FIGS. 13C and 13D.

Although the foregoing description referring to FIGS. 11A to 12B has discussed how to form a pair of thermocouples from polysilicon films, formed on the side walls of the recess 9 of the sacrificial layer 2, polysilicon films formed on the outer side walls of a protrusion may be formed into a pair of thermocouples.

Approximately the same explanation can be applied if the right two of the three polysilicon films illustrated in FIGS. 11A to 11C, not the left two, are used as a pair, and the region 9 defined as a recess in FIGS. 12A and 12B is defined as a protrusion.

The scheme of forming the hot junction 7-1 with the polysilicon films, formed on the inner side walls of one recess, as a pair (see FIG. 13C) is advantageous for several reasons.

Let us first compare those schemes based on the minimum finish size. FIGS. 13C and 13D respectively show the hot junction of the thermocouples on the inner walls of the recess and the hot junction of the thermocouples on the outer walls of the protrusion, with Whc1 and Whc2 indicating the widths of the respective contact metals, for the same minimum processing size Line=Space (see FIG. 11A) and the same process parameters for processing polysilicon.

It is apparent from the manufacturing method that Whc1<Whc2.

In miniaturization of pixels, therefore, it is advantageous to form the hot junction by connecting the polysilicon films on the inner walls of one recess to each other.

Paying attention to the portions indicated by arrows in FIGS. 13C and 13D, it is to be understood that the thermocouples formed by the polysilicon films on the inner walls of the recess are structurally more stable.

Although it is typical to use physical deposition like sputtering to form the contact metals, the step coverage at the step portion becomes an issue in that case.

While contact by contact metals is surely guaranteed for the contact structure formed by opposing curved portions of the polysilicon films in the cross-sectional view of FIG. 13C, the contact metals at the arrow-indicated portions in FIG. 13D become so thin that so-called step cracking may occur.

In view of those two reasons, on the hot junction side, it is preferable to employ the structure in FIG. 13C where the polysilicon films formed on the inner side walls of one recess are connected to each other as a pair of thermocouples.

Finally, a resist for forming the cavity structure 8 is formed and with this resist used as a mask, the silicon oxide films 2 and 5 are isotropically etched by an etching scheme which has an etching selectivity to the contact metals 7-1 and 7-2 and the polysilicon films 3 and 4. As a result, the structure shown in FIGS. 10A to 10C can be acquired.

When aluminum is used for the contact metals 7-1 and 7-2, for example, a mixed etching solution of acetic acid and ammonium fluoride by a ratio of 1:2 can be used in selective etching to form the cavity structure 8. For the silicon oxide films having a thickness of 1 $\mu$m, the cavity structure 8 can be formed through etching for about six minutes at the room temperature.

Further, metal silicide, such as molybdenum silicide, may be used for the contact metals. This modification is more preferable because a hydrofluoric acid solution or the like which has a fast etching speed can be used due to metal silicides generally having high chemical resistances.

Eighth Embodiment

Figure 14A:
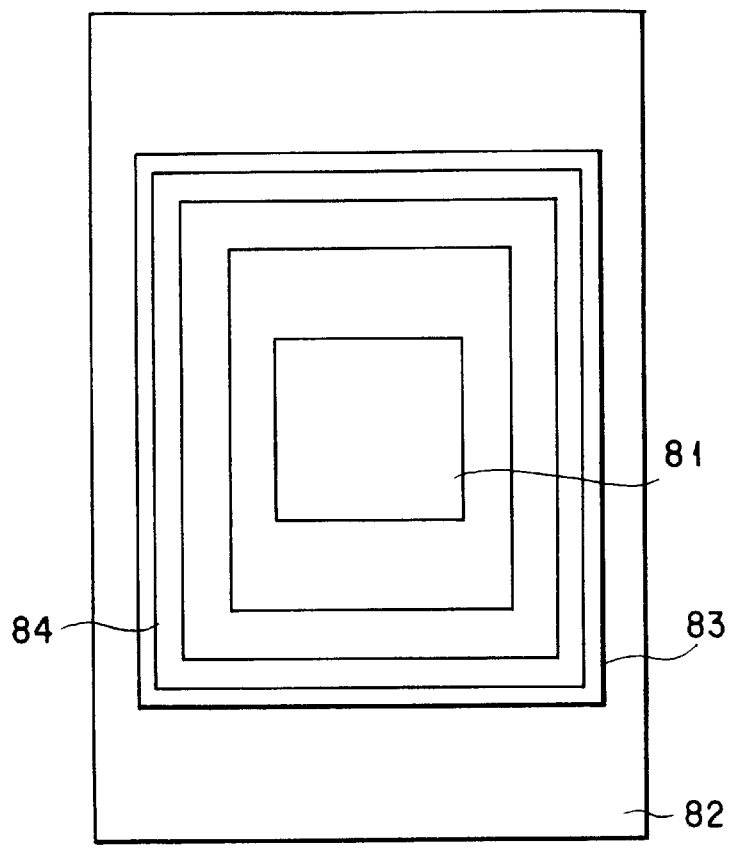
FIGS. 14A and 14B are a plan view and a cross-sectional view illustrating the structure of a unit pixel portion of an infrared solid-state image sensor according to an eighth embodiment.
Figure 14B:
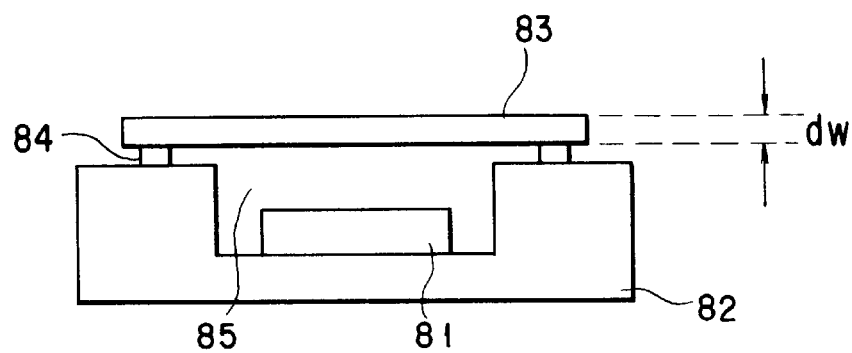

FIGS. 14A and 14B are exemplary diagrams for explaining the structure of an infrared solid-state image sensor according to the eighth embodiment of the invention. In this embodiment, the infrared solid-state image sensor is sealed inside an airtight package.

FIG. 14A is a plan view of the infrared solid-state image sensor and FIG. 14B is a cross-sectional view of a portion including a chip of the infrared solid-state image sensor. It is to be noted that those portions which do not concern the present invention are omitted from FIGS. 14A and 14B. For example, those portions which are associated with chip-bonding, such as the bonding pad and bonding wires on the chip of the infrared solid-state image sensor and bonding pad or the like on the package side, and the portion associated with the input/output pins from the package are omitted.

The structure in FIGS. 14A and 14B will be described while schematically explaining the steps from the completion of the manufacturing process of the infrared solid-state image sensor chip and the dicing step to the step of providing the structure in FIGS. 14A and 14B.

First, an infrared solid-state image sensor chip 81 with dicing completed is secured to an airtight package 82 by means of an adhesive (not shown), and a bonding pad (not shown) on the chip 81 and a bonding pad (not shown) on the airtight package side are connected by bonding wires (not shown) of, for example, aluminum. The infrared solid-state image sensor chip 81 may take the structure as shown in FIG. 1 or 2, or may take any one of the structures of the first to seventh embodiments as well.

Then, an infrared transmission window 83 is fixed by a sealing adhesive 84 onto the airtight package 82 to which the infrared solid-state image sensor chip 81 is secured. At this time, a heating process or high-energy irradiation may be executed to improve the adhesion and the airtightness.

Through the above steps, an infrared solid-state image sensor sealed with a predetermined filling gas 85 is completed as shown in FIGS. 14A and 14B.

According to this embodiment, the predetermined filling gas 85 may be gas having a lower thermal conductivity than nitrogen gas, such as argon gas, krypton gas or xenon gas. This eliminates the need for vacuum-sealing the airtight package while suppressing a considerable reduction in infrared ray sensitivity and keeping the high sensitivity, so that a compact, low-cost and long-lifetime infrared solid-state image sensor can be implemented.

As discussed earlier, an uncooled infrared solid-state image sensor suppresses an increase in thermal conductance G between the thermoelectric converting portion and the heat sink by forming a cavity between the semiconductor substrate to be the heat sink and the thermoelectric converting portion as shown in FIGS. 1 and 2.

To minimize an increase in thermal conductance by means of the cavity in FIGS. 1 and 2, it is typical to effect sealing by removing the filling gas atmosphere in the aforementioned step or vacuum-sealing of the infrared solid-state image sensor chip 81 (see, for example, Toshio Kanno, et al., Proc. SPIE vol. 2269, pp. 450–459, 1994 or R. A. Wood, Proc. IEDM, pp. 175–177, 1993).

This vacuum sealing requires that the infrared transmission window 83 should have the dynamic strength high enough to endure a differential pressure between the atmospheric pressure and vacuum, in addition to the infrared transmittance. This inevitably increases the thickness of the infrared transmission window 83 indicated by "dw" in FIG. 14B and deteriorates the infrared transmittance. Likewise, the sealing adhesive 84 and the airtight package 82 need dynamic strengths high enough to endure the atmospheric pressure. This results in a larger size and higher cost than those of the structure of this embodiment. Further, vacuum sealing involves leakage of gas or the like from the sealing member, so that the deterioration of the degree of vacuum inside the package leads to another deterioration such as reduction in the sensitivity of the infrared solid-state image sensor.

By contrast, this embodiment does not require dynamic strengths for the various materials so that particularly the thickness dw of the infrared transmission window 83 can be reduced significantly. This results in a considerable reduction in material cost while improving the infrared transmittance.

In the existing scheme of sealing the package of a visible light solid stage image sensor, nitrogen gas which is inactive and cheap is used as the filling gas 85. Applying this nitrogen-based sealing to an infrared solid-state image sensor makes larger an increase in the thermal conductance, caused by the cavity in FIGS. 1 and 2, undesirably resulting in a decreased sensitivity of the infrared solid-state image sensor.

According to this embodiment, gas having a lower thermal conductivity than nitrogen gas is used as the predetermined filling gas 85 to eliminate the requirement on the dynamic strength needed to vacuum-seal the apparatus while suppressing an increase in the thermal conductance. This provides a high-sensitivity and very-low-cost infrared solid-state image sensor which is free of deterioration of characteristics that would otherwise be originated from a drop of the degree of vacuum, and therefore has a long lifetime.

The following will discuss the results of selecting argon, krypton and xenon as the filling gas 85 as present examples in place of nitrogen which is typical in a visible light image sensing apparatus.

Of those gases, xenon has the lowest thermal conductivity K of $5.62 \times 10^{-3}$ W/m·K, less than one fourth the thermal conductivity of nitrogen which is $2.60 \times 10^{-2}$ W/m·K. The thermal conductivities of argon and krypton are $1.77 \times 10^{-2}$ W/m·K and $9.42 \times 10^{-3}$ W/m·K, respectively, both lower than that of nitrogen.

Given that the cavity shown in FIGS. 1 and 2 has an average depth d=2 [$\mu$m] and the opposing area of the thermoelectric converting portion to the substrate in the cavity is $S=100 \times 100 = 10^4$ $\mu m^2$, the filling gas originated thermal conductance G is obtained from G (gas)=K×S/d. The thermal conductances for xenon and nitrogen are respectively $2.81 \times 10^{-5}$ W/K and $1.3 \times 10^{-4}$ W/K. Likewise, the thermal conductances for argon and krypton are respectively $8.85 \times 10^{-5}$ [W/m·k] and $4.71 \times 10^{-5}$ [W/m·k].

The sensitivity R of the infrared solid-state image sensor is expressed by the equation 1 in the case of a thermopile, for example. For a bolometer type or pyroelectric type, the sensitivity R is expressed similarly with respect to the thermal conductance G (see, for example, Paul w. Kruse, Proc. SPIE, Vol. 2552, pp. 556–563), and it is inversely proportional to the thermal conductance G, as the first approximation.

While there is no increase in thermal conductance caused by the filling gas in vacuum, there is a thermal conductance G0 generated by the support structure for the thermoelectric converting portion in the structure shown in FIGS. 1 and 2.

Let us consider an infrared solid-state image sensor having a square thermoelectric converting portion which has the aforementioned area of $100 \times 100 = 10^4$ $\mu m^2$ and is supported by a silicon oxide film with a width w of 100 $\mu$m, a length l of 10 $\mu$m and a thickness d of 1 $\mu$m. The thermal conductance G0 produced by the then support structure is given by $$G0 = 4 \times G(SiO_2) \times (w \times d)/l$$

where $G(SiO_2)$ is the thermal conductivity of the silicon oxide film which is 1.4 W/m·K. Substituting the given values in this equation yields $G0 = 1.4 \times 10^{-5}$ W/K.

Let us compare the sensitivities in terms of the first approximation in cases where infrared solid-state image sensor chips with the above-described structure are sealed under three kinds of atmospheres, namely, vacuum, xenon gas and nitrogen gas. With the influences of radiation and convection considered negligible, the sensitivities can be compared in terms of the reciprocal of the sum of the thermal conductance G0 produced by the support structure and the thermal conductance G(gas) produced by the sealing gas including vacuum, 1/(G0+G(gas)). With the sensitivity in vacuum being 1, the sensitivities for the nitrogen sealing and the xenon sealing of 9.7% and 33.3% respectively can be obtained by simple computation.

When nitrogen gas sealing is adapted to a visible light image sensing apparatus for the purpose of reducing the size and cost of an airtight package structure, the sensitivity of an infrared solid-state image sensor is dropped to 1/10. Adapting xenon gas sealing as employed in this embodiment can stop the sensitivity drop, caused by the downsizing and cost reduction of the structure, to just 1/3. As mentioned earlier, the use of no vacuum sealing has an effect not only on elongation of the lifetime of the infrared solid-state image sensor as well as on downsizing and cost reduction.

The rough computation of the sensitivity in this embodiment is carried out with the cavity in FIGS. 1 and 2 having an average depth of 2 $\mu$m. In designing the chip of an infrared solid-state image sensor, it is more preferable to make the cavity deeper because such can further suppress an increase in the thermal conductance originated from the heat conduction of the filling gas inside the airtight package. A similar advantage can be achieved by reducing the opposing area of the cavity.

The present examples and embodiment are to be considered as illustrative and not restrictive and the invention is not to be limited to the above-described embodiments, but may be modified in various other forms within the scope and spirit of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. An infrared solid-state image sensor comprising:
   a semiconductor substrate having a cavity structure;
   a first diaphragm arranged in said cavity structure and supported to said semiconductor substrate via a first support portion, wherein an infrared absorption layer and a hot junction of thermocouples for converting a temperature change, caused by irradiation of infrared rays to said infrared absorption layer, to an electric signal are formed on said first diaphragm; and
   a second diaphragm arranged in said cavity structure to surround said first diaphragm and supported to said semiconductor substrate via a second support portion, wherein a wiring portion to transfer a signal from said hot junction of said thermocouples is formed on said second diaphragm.

2. The infrared solid-state image sensor according to claim 1, wherein a material for said thermocouples is polysilicon.

3. The infrared solid-state image sensor according to claim 1, wherein said thermocouple is a single thermocouple and is formed in a unit pixel.

4. The infrared solid-state image sensor according to claim 3, wherein a material for said thermocouples is polysilicon.

5. The infrared solid-state image sensor according to claim 1, wherein metal or metal silicide for forming said hot junction of said thermocouples is formed on an entire region where said infrared absorption layer is formed.

6. The infrared solid-state image sensor according to claim 5, wherein a material for said thermocouples is polysilicon.

7. The infrared solid-state image sensor according to claim 1, wherein
   said first diaphragm has a rectangular shape, and one corner portion of said first diaphragm is connected via said first support portion to said semiconductor substrate; and
   said second diaphragm is connected to said semiconductor substrate via second support portions at two locations close to said first support portion, and said infrared absorption layer formed on said first diaphragm is connected to said hot junction of said thermocouples at an orthogonal position to said first support portion of said first diaphragm.

8. The infrared solid-state image sensor according to claim 7, wherein a material for said thermocouples is polysilicon.

9. The infrared solid-state image sensor according to claim 7, wherein a single thermocouple is formed in a unit pixel.

10. The infrared solid-state image sensor according to claim 9, wherein a material for said thermocouples is polysilicon.

11. The infrared solid-state image sensor according to claim 7, wherein metal or metal silicide for forming said hot junction of said thermocouples is formed on an entire region where said infrared absorption layer is formed.

12. The infrared solid-state image sensor according to claim 11, wherein a material for said thermocouples is polysilicon.

13. An infrared solid-state image sensor comprising:

a semiconductor substrate;

a first diaphragm supported on said semiconductor substrate via a first support portion, wherein a wiring portion which outputs a signal from a hot junction of a thermocouple is formed on said first diaphragm; and a second diaphragm, supported on said first diaphragm via a second support portion, wherein an infrared absorption layer is formed on said second diaphragm and said hot junction of said thermocouple which converts a temperature change, caused by irradiation of infrared rays to said infrared absorption layer, to an electrical signal, is formed on said first diaphragm, wherein said first diaphragm and said second diaphragm are formed by a same layer.

14. The infrared solid-state image sensor according to claim 13, wherein a material for said thermocouples is polysilicon.

15. The infrared solid-state image sensor according to claim 13, wherein a single thermocouple is formed in a unit pixel.

16. The infrared solid-state image sensor according to claim 15, wherein a material for said thermocouples is polysilicon.

17. The infrared solid-state image sensor according to claim 13, wherein metal or metal silicide for forming said hot junction of said thermocouples is formed on an entire region where said infrared absorption layer is formed.

18. The infrared solid-state image sensor according to claim 17, wherein a material for said thermocouples is polysilicon.

19. An infrared solid-stage image sensor comprising:

a semiconductor substrate;

a first diaphragm supported on said semiconductor substrate via a first support portion, in which a wiring portion which outputs a signal from a hot junction of a thermocouple is formed on said first diaphragm; and a second diaphragm, supported on said first diaphragm via a second support portion, in which an infrared absorption layer is formed on said second diaphragm and said hot junction of said thermocouple which converts a temperature change, caused by irradiation of infrared rays to said infrared absorption layer, to an electric signal, is formed on said first diaphragm, wherein said first diaphragm and said second diaphragm are formed by different layers.

20. The infrared solid-state image sensor according to claim 19, wherein a material for said thermocouples is polysilicon.

21. The infrared solid-state image sensor according to claim 19, wherein a single thermocouple is formed in a unit pixel.

22. The infrared solid-state image sensor according to claim 21, wherein a material for said thermocouples is polysilicon.

23. The infrared solid-state image sensor according to claim 19, wherein metal or metal silicide for forming said hot junction of said thermocouples is formed on an entire region where said infrared absorption layer is formed.

24. The infrared solid-state image sensor according to claim 23, wherein a material for said thermocouples is polysilicon.

25. An infrared solid-state image sensor comprising:

a semiconductor substrate; and a thermocouple for converting a temperature change, caused by irradiation of infrared rays, to an electric signal, wherein said semiconductor substrate has a cavity structure in at least a part between said semiconductor substrate and said thermocouple, and a hot junction of said thermocouple is supported substantially only by said thermocouple to form said cavity structure.

26. The infrared solid-state image sensor according to claim 25, wherein said thermocouples are made of polysilicon.

27. The infrared solid-state image sensor according to claim 25, wherein a height h of said thermocouple is larger than a width w thereof.

28. The infrared solid-state image sensor according to claim 27, wherein said thermocouples are made of polysilicon.

29. The infrared solid-state image sensor according to claim 13, wherein said first diaphragm is Z-shaped, and two end portions of said Z-shaped diaphragm are connected to said semiconductor substrate.

30. The infrared solid-state image sensor according to claim 29, wherein said second diaphragm is connected at substantially a center of said Z-shaped diaphragm.

31. The infrared solid-state image sensor according to claim 13, wherein said first diaphragm is connected at substantially a center of said second diaphragm.

32. The infrared solid-state image sensor according to claim 19, wherein said first diaphragm is Z-shaped, and two ends portions of said Z-shaped diaphragm are connected to said semiconductor substrate.

33. The infrared solid-state image sensor according to claim 32, wherein said second diaphragm is connected at substantially a center of said Z-shaped diaphragm.

34. The infrared solid-stage image sensor according to claim 19, wherein said first diaphragm is connected at substantially a center of said second diaphragm.

* * * * *